United States Patent
Hitaka et al.

(10) Patent No.: US 9,859,683 B2
(45) Date of Patent: Jan. 2, 2018

(54) DISTRIBUTED FEEDBACK SEMICONDUCTOR LASER ELEMENT

(71) Applicant: HAMAMATSU PHOTONICS K.K., Hamamatsu-shi, Shizuoka (JP)

(72) Inventors: Masahiro Hitaka, Hamamatsu (JP); Yutaka Takagi, Hamamatsu (JP); Takahiro Sugiyama, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/397,868

(22) Filed: Jan. 4, 2017

(65) Prior Publication Data

US 2017/0201069 A1 Jul. 13, 2017

(30) Foreign Application Priority Data

Jan. 8, 2016 (JP) ................. 2016-002923

(51) Int. Cl.
*H01S 5/00* (2006.01)
*H01S 5/12* (2006.01)
(Continued)

(52) U.S. Cl.
CPC ............ *H01S 5/12* (2013.01); *H01S 5/06804* (2013.01); *H01S 5/2009* (2013.01); *H01S 5/34* (2013.01);
(Continued)

(58) Field of Classification Search
CPC . H01S 5/12; H01S 5/3408; H01S 5/34; H01S 5/34313; H01S 5/34353; H01S 5/06804; H01S 5/2009; H01S 5/3407
See application file for complete search history.

(56) References Cited

U.S. PATENT DOCUMENTS

2004/0208213 A1* 10/2004 Lichtenstein ............. H01S 5/20
    372/45.012
2005/0201437 A1* 9/2005 Reid ........................ H01S 5/12
    372/43.01

(Continued)

FOREIGN PATENT DOCUMENTS

JP 2647018 B2 8/1997
JP H09283837 A 10/1997
JP 2007-249829 A 9/2007

OTHER PUBLICATIONS

Kyosuke Sakai et al., "Coupled-Wave Theory for Square-Lattice Photonic Crystal Lasers With TE Polarization," IEEE Journal of Quantum Electronics, May 2010, pp. 788-795, vol. 46, No. 5.

(Continued)

*Primary Examiner* — Kinam Park
(74) *Attorney, Agent, or Firm* — Drinker Biddle & Reath LLP

(57) ABSTRACT

A DFB laser element includes an active layer 4 having a multiple quantum well structure including a plurality of well layers 4B having different thicknesses, a diffraction grating layer 6 that is optically coupled to the active layer 4, and a pair of cladding layers with the active layer 4 and the diffraction grating layer 6 interposed therebetween. An effective refractive index of the diffraction grating layer 6 is high, and a thickness of the well layer 4B increases as a distance from the diffraction grating layer 6 increases. In this structure, it is possible to reduce dependence on temperature when the DFB semiconductor laser element is miniaturized.

10 Claims, 14 Drawing Sheets

(51) Int. Cl.
*H01S 5/34* (2006.01)
*H01S 5/20* (2006.01)
*H01S 5/068* (2006.01)
*H01S 5/343* (2006.01)

(52) U.S. Cl.
CPC .......... *H01S 5/3407* (2013.01); *H01S 5/3408* (2013.01); *H01S 5/34313* (2013.01); *H01S 5/34353* (2013.01)

(56) References Cited

U.S. PATENT DOCUMENTS

| | | | |
|---|---|---|---|
| 2005/0213625 A1* | 9/2005 | Horie .................... | B82Y 20/00 372/44.01 |
| 2008/0199131 A1* | 8/2008 | Matsuda ................ | B82Y 20/00 385/37 |
| 2008/0219315 A1* | 9/2008 | Makino ................. | B82Y 20/00 372/50.1 |
| 2010/0246625 A1* | 9/2010 | Kawashima .......... | B82Y 20/00 372/45.01 |

OTHER PUBLICATIONS

Kazuyoshi Hirose et al., "Watt-class high-power, high-beam-quality photonic-crystal lasers," Nature Photonics, May 2014, pp. 406-411, vol. 8.

* cited by examiner

Fig.1
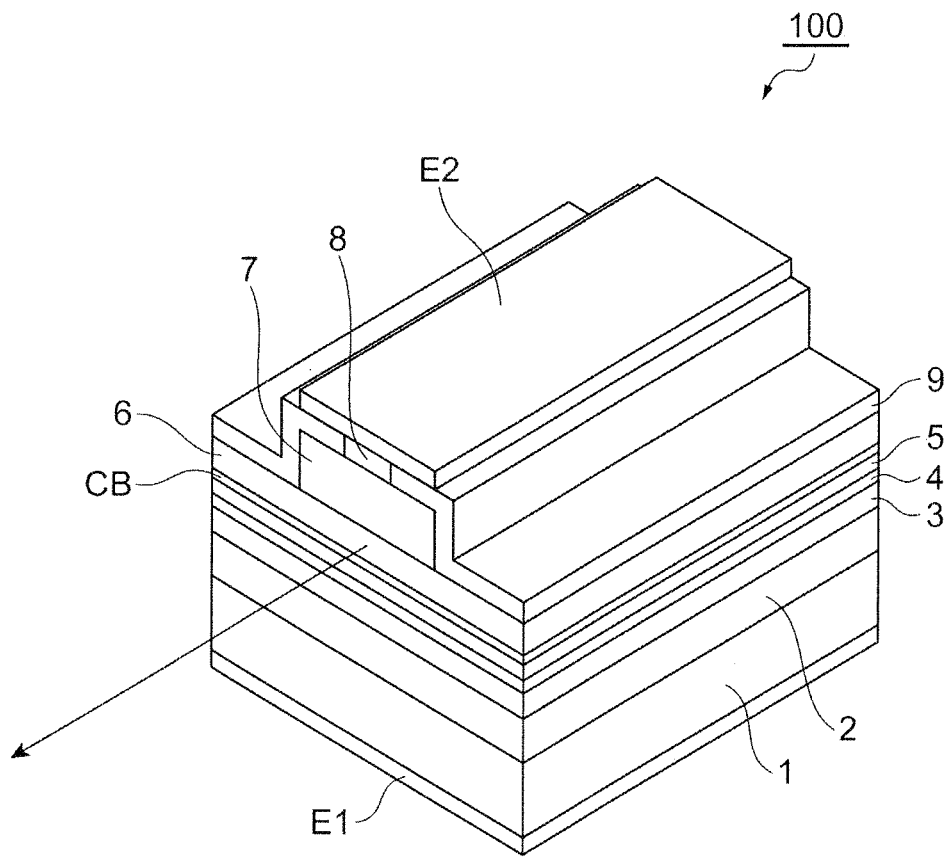
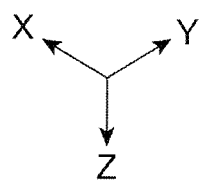

Fig.7A
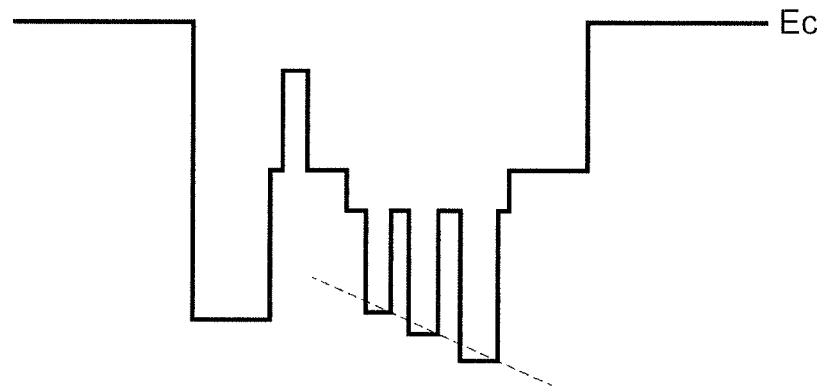
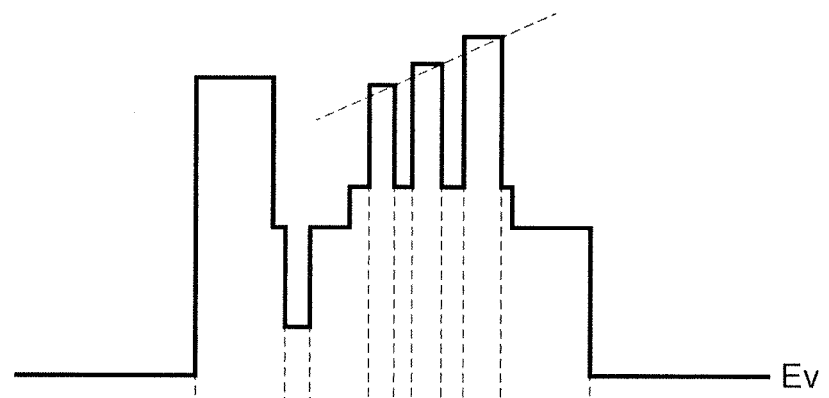
Fig.7B
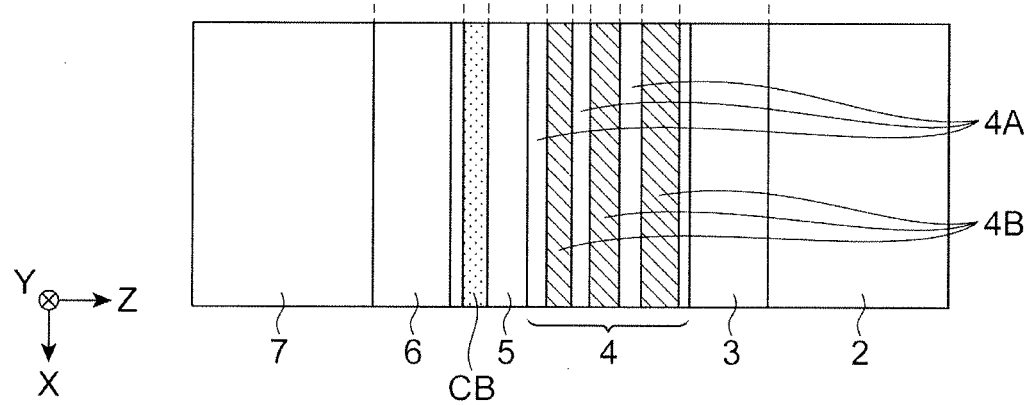

Fig.13

| | MATERIAL | CONDUCTIVITY TYPE | THICKNESS (nm) |
|---|---|---|---|
| CONTRACT LAYER 8 | GaAs | — | 50~500 (200) |
| UPPER CLADDING LAYER 7 | AlGaAs | P | $1\times10^3 \sim 3\times10^3$ ($2\times10^3$) |
| DIFFRACTION GRATING LAYER 6 (REFRACTIVE INDEX MODULATION LAYER) | BASE LAYER 6A: GaAs<br>DIFFERENT-REFRACTIVE-INDEX REGION 6B: AlGaAs | — | 50~400 (300) |
| CARRIER BARRIER LAYER CB | AlGaAs | — | 0~100 (25) |
| UPPER OPTICAL GUIDE LAYER 5 | AlGaAs | — | 0~300 (10) |
| ACTIVE LAYER 4 (MQW) | BARRIER LAYER: AlGaAs<br>WELL LAYER: InGaAs | — | BARRIER LAYER: EACH 10 TO 100 (EACH 10)<br>WELL LAYER: EACH 5 TO 15 (EACH 10) |
| LOWER OPTICAL GUIDE LAYER 3 | AlGaAs | — | 0~300 (150) |
| LOWER CLADDING LAYER 2 | AlGaAs | N | $1\times10^3 \sim 3\times10^3$ ($2\times10^3$) |
| SEMICONDUCTOR SUBSTRATE 1 | GaAs | N | $80\times10^3 \sim 350\times10^3$ ($150\times10^3$) |

DISTRIBUTED FEEDBACK SEMICONDUCTOR LASER ELEMENT

TECHNICAL FIELD

The present invention relates to a distributed feedback (DFB) semiconductor laser element.

BACKGROUND

In the related art, a Fabry-Perot laser element (FP laser element) using a Fabry-Perot resonator is known as a semiconductor laser element. Since stability of an oscillation mode in this FP laser element is low, a DFB semiconductor laser element has been proposed as an improved semiconductor laser element. In the DFB semiconductor laser element, a diffraction grating is provided inside a resonator, and laser light with a wavelength component selected by the diffraction grating is amplified.

In a DFB semiconductor laser element described in Japanese Unexamined Patent Publication No. 9-283837, a barrier layer is disposed between well layers with different thicknesses in an active layer having a multiple quantum well (MQW) structure, and the layers are formed of InGaAsP.

In an InGaAsP-based DFB semiconductor laser element described in Japanese Patent No. 2647018, there is a problem in that, when an operation temperature is changed, a gain peak fluctuates due to dependence of a band gap energy of a semiconductor on temperature, and a Bragg wavelength fluctuates due to dependence of a refractive index of the semiconductor on temperature.

Therefore, in Japanese Patent No. 2647018, quantum well layers having different thicknesses are alternately arranged and a plurality of gain spectra corresponding to a group of quantum well layers with respective thicknesses are set to reduce dependence of an optical gain peak wavelength on temperature.

In an InGaAsP-based DFB semiconductor laser element described in Japanese Unexamined Patent Publication No. Hei 7-249829, similarly, film thicknesses of a plurality of quantum well layers are changed.

As a distance from the diffraction grating decreases, the film thicknesses of the well layers increase, an emission wavelength increases, and dependence of an optical gain peak wavelength on temperature is reduced.

SUMMARY

However, in the industrial field, further miniaturization of a DFB semiconductor laser element having a plurality of quantum well layers of the related art is expected. That is, an element size can be reduced by shortening a resonator length of the DFB semiconductor laser element. However, when a resonator length L is simply reduced, modes are not uniformly distributed in a resonator, and light emission with sufficient intensity cannot be secured. In a normal one-dimensional DFB semiconductor laser, it is known that modes can be uniformly distributed in the resonator if a product of a coupling coefficient κ of the diffraction grating and a resonator length L is set to about 1 to 3. Therefore, an increase in the coupling coefficient κ is necessary for miniaturization of the resonator. It is considered that the emission intensity should be able to be maintained at an appropriate value by increasing an optical confinement factor Γg since the coupling coefficient κ is proportional to the optical confinement factor Γg of a diffraction grating portion. In this case, if a refractive index in the vicinity of a diffraction grating layer of the DFB semiconductor laser element is set to be higher than that of the active layer, the optical confinement factor Γg relatively increases. However, a peak position of an optical field intensity distribution is close to a position of the diffraction grating layer from the active layer. Therefore, the active layer is located in a region in which a change in the optical field intensity distribution is abrupt, and optical output may become unstable with respect to a change in the optical field intensity distribution due to a temperature change or the like.

Therefore, in a case in which the DFB semiconductor laser element is miniaturized, the temperature dependence remains high in a method of the related art.

The present invention has been made in view of such problems, and an object of the present invention is to provide a distributed feedback laser element capable of reducing dependence on temperature when the DFB semiconductor laser element is miniaturized.

In order to solve the above problems, a distributed feedback (DFB) semiconductor laser element according to the present invention includes: an active layer having a multiple quantum well (MQW) structure including a plurality of well layers having different thicknesses; a diffraction grating layer that is optically coupled to the active layer; and a pair of cladding layers with the active layer and the diffraction grating layer interposed therebetween, wherein when a region that is interposed between the cladding layers is defined as a core layer, the diffraction grating layer includes a layer having a refractive index higher than an average refractive index of the core layer, and a thickness of the well layer increases as a distance from the diffraction grating layer increases.

For the average refractive index (or average dielectric constant) of the core layer, more specifically, for example, when layers in the core layer are numbered in an order from a P-type cladding layer as 1, 2, . . . , m (m is a natural number), parameters are set in the numbered layers as follows. •Dielectric constant: ∈1, ∈2, . . . , ∈m •refractive index: $N_1, N_2, \ldots, N_m$ ∩film thickness: $W_1, W_2, \ldots, W_m$.

In this case, an average dielectric constant (a square of the refractive index) $\epsilon_{ave}$ becomes an average per volume of a dielectric constant of each layer and is expressed by the following equation.

$$\text{Average dielectric constant } \varepsilon_{ave} = \sum_{i=1}^{m} \varepsilon_i W_i \bigg/ \sum_{i=1}^{m} W_i \quad \text{(Equation 1)}$$

By taking a square root of the average dielectric constant, the average refractive index $N_{ave}$ is defined as the following equation.

$$\text{Average refractive index } N_{ave} = \sqrt{\sum_{i=1}^{m} N_i^2 W_i \bigg/ \sum_{i=1}^{m} W_i} \quad \text{(Equation 2)}$$

That is, in the present invention, a configuration in which an increase in the refractive index of the diffraction grating layer leads to an increase in the optical confinement factor Γ, and that solves a resultant problem, that is, in which the thickness of the well layer increases as the distance from the diffraction grating layer increases to compensate for rapid degradation of the optical field intensity according to a position in the active layer has been adopted.

That is, since the thickness of the well layer increases as the distance from the diffraction grating layer increases, the optical confinement factors Γqw in each well layer are uniformized, and the gain spectrum corresponding to the well layer of each wavelength is stabilized. Since stable gain spectrums having different peak wavelengths are generated corresponding to the plurality of well layers, any one of the gain spectrums and a selected spectrum including a wavelength (energy band end wavelength) selected by the diffraction grating layer can match even when temperature change occurs, and the dependence of the emission spectrum on temperature caused by overlapping of the spectra can also be reduced.

Further, a second distributed feedback semiconductor laser element includes one or more layers having a higher refractive index than a mode equivalent refractive index with respect to light propagating through the core layer between the diffraction grating layer and the well layers.

In a third distributed feedback semiconductor laser element, the number of well layers is two or more.

In a fourth distributed feedback semiconductor laser element, when N is a natural number, a thickness of an N-th well layer from the diffraction grating layer among the plurality of well layers is d(N), and the optical confinement factor of the N-th well layer is Γ(N), a relative change in Γ(N) is 10% or less.

In a fifth distributed feedback semiconductor laser element, when the diffraction grating layer is one-dimensional, a coupling coefficient κ of the diffraction grating layer satisfies the following relationship expression: $20 \text{ cm}^{-1} \leq \kappa \leq 1000 \text{ cm}^{-1}$.

In a sixth distributed feedback semiconductor laser element, the diffraction grating layer is a two-dimensional diffraction grating layer.

In a seventh distributed feedback semiconductor laser element, the diffraction grating layer includes: a base layer; and a plurality of different-refractive-index regions having a refractive index different from that of the base layer, wherein the different-refractive-index region is arranged at a grating point position on a square grating including horizontal lines connecting angular positions of 0° and 180° and vertical lines connecting angular positions of 90° and 270° in a plan view as viewed in a direction perpendicular to the base layer, the diffraction grating layer constitutes a two-dimensional square grating diffraction grating layer, and a coupling coefficient κ1 in a 90° direction and a coupling coefficient κ3 in a 180° direction satisfy the following relationship expressions: $100 \text{ cm}^{-1} \leq \kappa 1 \leq 5000 \text{ cm}^{-1}$, and $50 \text{ cm}^{-1} \leq \kappa 3 \leq 5000 \text{ cm}^{-1}$.

In an eighth distributed feedback semiconductor laser element, the active layer includes a barrier layer between the well layers, a band gap energy of the barrier layer is set to be lower than a band gap energy of the cladding layer, and a band gap energy of the well layer is set to be lower than the band gap energy of the barrier layer.

A ninth distributed feedback semiconductor laser element includes, between the active layer and the diffraction grating layer, a carrier barrier layer that suppresses movement of carriers between the active layer and the diffraction grating layer.

A tenth distributed feedback semiconductor laser element includes an active layer having a multiple quantum well structure including a plurality of well layers having different thicknesses; a diffraction grating layer that is optically coupled to the active layer; and a pair of cladding layers with the active layer and the diffraction grating layer interposed therebetween, wherein when a region that is interposed between the cladding layers is defined as a core layer, the diffraction grating layer includes a layer having a refractive index higher than an average refractive index of the core layer, and a band gap energy that is defined by a material of the well layers decreases as a distance from the diffraction grating layer increases.

According to the DFB semiconductor laser element of the present invention, it is possible to reduce dependence on temperature even when the DFB semiconductor laser element is miniaturized.

BRIEF DESCRIPTION OF THE DRAWINGS

FIG. 1 is a perspective view of a DFB semiconductor laser element.

FIG. 7A is an energy band diagram in a DFB semiconductor laser element in which a depth of a well layers has been changed, and FIG. 7B is a view illustrating an XZ cross-sectional structure.

FIG. 13 is a table showing physical properties of each semiconductor layer.

DETAILED DESCRIPTION

Figure 2:
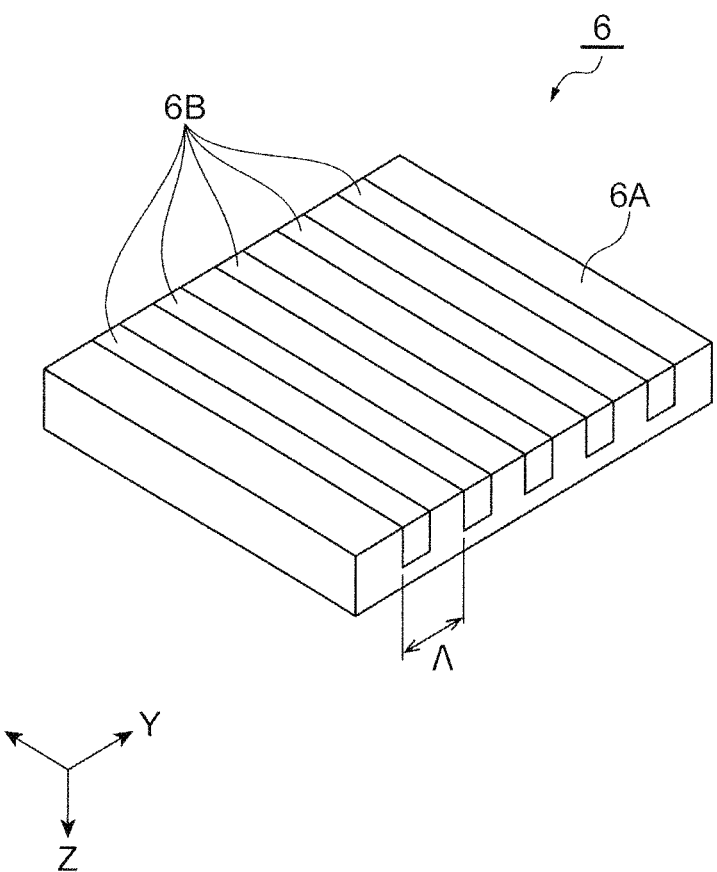
FIG. 2 is a perspective view of a diffraction grating layer.

Hereinafter, a DFB semiconductor laser element according to an embodiment will be described. The same reference numerals are used for the same elements, and repeated description will be omitted.

(1) End Face Emission Type DFB Semiconductor Laser Element

FIG. 1 is a perspective view of a DFB semiconductor laser element 100. An XYZ three-dimensional orthogonal coordinate system is set, a thickness direction of the DFB semiconductor laser element 100 is set as a Z axis, and two axes perpendicular to the Z axis are set as an X-axis and a Y-axis. When laser light is emitted from an end surface, an emission direction of the laser light is set to be parallel to the Y-axis.

When this DFB semiconductor laser element 100 is manufactured, a lower cladding layer 2 formed of a first conductivity type (N-type) of AlGaAs, a lower optical guide layer 3 formed of AlGaAs, an active layer 4 having a multi-quantum well (MQW) structure (barrier layer: AlGaAs and well layer: InGaAs), an upper optical guide layer 5 formed of AlGaAs, and a diffraction grating layer 6 (refractive index modulation layer) formed of GaAs are produced by crystal growth on a semiconductor substrate 1 formed of a first conductivity type (N-type) of GaAs using a metal organic vapor phase epitaxy (MOCVD) method or a molecular beam epitaxy (MBE) method.

Then, a one-dimensional stripe structure is formed on a surface of the diffraction grating layer 6 using a microfabrication technology. In this case, a grating period Λ is set so that an optical length thereof is a length corresponding to a half wavelength of the laser light (Λ=λ) to correspond to a first-order diffraction grating (see FIG. 2). That is, the diffraction grating layer 6 is essentially a grown layer in which a formed base layer 6A (GaAs) is processed in a stripe shape using a photolithography technology, and a material having a refractive index different from that of the base layer 6A, for example, a different-refractive-index region 6B formed of AlGaAs is embedded in gaps between the stripes using an MOCVD method. Each stripe extends in a direction (X-axis direction) perpendicular to a Y-axis direction that is a direction of a resonator length. For example, laser light in 940, 980, and 1060 nm bands as emission wavelengths can be adopted. Further, when high-order diffraction is used, the emission wavelength may be set to be an integer multiple of the grating period Λ.

Subsequently, the upper cladding layer 7 formed of a second conductivity type (P-type) of AlGaAs and the contact layer 8 formed of a second conductivity type (P-type) of GaAs are produced by crystal growth on the diffraction grating layer 6 using an MOCVD method. The upper cladding layer 7 may be formed subsequently to the process of forming the different-refractive-index regions 6B in the diffraction grating layer 6. Air or an inert gas may be used for the different-refractive-index regions 6B in the diffraction grating layer 6 or the different-refractive-index regions 6B may be in a vacuum state.

Regions at both ends in a width direction of the upper cladding layer 7 are removed by providing a mask so as to limit growth at the time of crystal growth or by etching after crystal growth. Further, regions on both sides in the Y-axis direction of the contact layer 8 are removed using a photolithography technology so that only an elongated region along the X-axis direction which is a resonator length direction remains. Accordingly, a mesa type stripe structure including the cladding layer 7 and the contact layer 8 is formed.

Subsequently, an insulating film 9 is formed so as to cover the exposed surface of the stripe structure. The insulating film 9 on the contact layer 8 corresponding to a resonator is removed by etching to expose the contact layer 8 and an upper electrode E2 is formed to come in contact with the contact layer 8. Meanwhile, a lower electrode E1 is provided on a lower surface of the semiconductor substrate 1. For a method of forming the lower electrode E1 and the upper electrode E2, a vapor deposition method or a sputtering method may be used.

A carrier barrier layer CB can be formed between the active layer 4 and the diffraction grating layer 6 using an MOCVD method or an MBE method. The carrier barrier layer CB suppresses the movement of carriers between the active layer 4 and the diffraction grating layer 6. In this embodiment, the carrier barrier layer CB is formed of AlGaAs and provided in the upper optical guide layer 5. A band gap energy of the carrier barrier layer CB is higher than that of the upper optical guide layer 5.

Thereafter, if a direction of a mesa stripe is an Y-axis, the compound semiconductor substrate is cleaved into a chip that is a semiconductor laser element to a length of an interval of about 1 to 3 mm in a Y-axis direction, an anti-reflection film (not illustrated) is formed on the cleaved end surface (light output surface: XZ plane), and a highly reflective film (not illustrated) is formed on a surface opposite to the light output surface.

Then, the electrode E2 located in an upper portion of the semiconductor laser element is mounted on a sub-mount with a solder material, and then, the sub-mount is die-bonded to a base using a solder material. For both of the solder materials, In, Au/Sn, or the like may be used. The electrode E1 located in the lower portion is connected to a base electrode by wire bonding such as with Au wire, such that current driving can be realized. In the above process, a semiconductor laser element unit is formed.

In an AlGaAs-based compound semiconductor, a band gap energy of GaAs is 1.47 eV and a band gap energy of AlAs is 2.16 eV. By increasing a compositional fraction X of Al, the band gap energy is increased.

A composition fraction X of Al of each layer in $Al_XGa_{1-X}As$ is the same as an order of the band gap energies. Further, when In having a large atomic radius is contained in a crystal structure, the band gap energy decreases. The composition fraction X of Al is smallest in the semiconductor substrate 1 and the contact layer 8 formed of GaAs, and X=0. However, some Al may be contained. Further, the band gap energy is smaller in a layer in which In is contained in GaAs, and the band gap energy of the well layers formed of InGaAs is smallest. Thus, the Al composition ratio increases in an order of the barrier layers in the active layer 4, the optical guide layer (the lower optical guide layer 3 and the upper optical guide layer 5), the carrier barrier layer CB, and the cladding layers (the lower cladding layer 2 and the upper cladding layer 7).

In general, when the Al composition fraction X increases or the In composition ratio decreases such that the band gap energy increases, the dielectric constant a and the refractive index n of the material decrease. It is preferable for the refractive index n to be increased in order to confine the laser light in a layer direction. In other words, it is preferable for the Al composition fraction X to be decreased. In the diffraction grating layer 6, since the base layer is formed of a material containing GaAs or some Al and includes a region with a higher refractive index than the average refractive index of the core layer, the optical field is biased to the diffraction grating layer 6. The refractive index is a refractive index with respect to light with a wavelength of 980 nm unless otherwise mentioned.

A material of each layer is as illustrated in FIG. 13, wherein a column for the thickness indicates a preferred range, and a value in parentheses indicates a value in a specific example. Details are as follows.

The semiconductor substrate 1 is formed of GaAs, a thickness thereof is 150 μm, a conductivity type thereof is an N type, and an impurity concentration thereof is $1 \times 10^{18}$ cm$^{-3}$. The thickness is preferably 80 μm or more and 350 μm or less, and the impurity concentration is preferably $1 \times 10^{19}$ cm$^{-3}$ or more and $1 \times 10^{17}$ cm$^{-3}$ or less.

The lower cladding layer 2 is formed of Al$_X$Ga$_{1-X}$As, a composition fraction X of Al is 0.7, a thickness thereof is 2 μm, a conductivity type thereof is an N type, and an impurity concentration thereof is $1 \times 10^{18}$ cm$^{-3}$. The composition fraction X of Al is preferably 0.3 or more, the thickness thereof is preferably 1 μm or more and 3 μm or less, and the impurity concentration thereof is preferably $1 \times 10^{19}$ cm$^{-3}$ or more and $1 \times 10^{17}$ cm$^{-3}$ or less.

The lower optical guide layer 3 is formed of Al$_X$Ga$_{1-X}$As, a composition fraction X of Al is 0.1, a thickness thereof is 150 nm, a conductivity type thereof is an I type, and an impurity concentration thereof is $1 \times 10^{16}$ cm$^{-3}$ or less. The composition fraction X of Al is preferably 0.1 or more and less than or equal to a barrier layer composition, a thickness thereof is preferably 0 nm or more and 300 nm or less, and an impurity concentration thereof is preferably $1 \times 10^{16}$ cm$^{-3}$ or less.

An I type is assumed to be an I type of which the impurity concentration is of $1 \times 10^{16}$ cm$^{-3}$ or less.

A barrier layer in the active layer 4 is formed of Al$_X$Ga$_{1-X}$As, a composition fraction X of Al is 0.1, a thickness thereof is 10 nm, and a conductivity type thereof is an I type. The composition fraction X of Al is preferably 0.3 or more and less than or equal to that of a lower cladding layer composition or less, and a thickness thereof is preferably 10 nm or more and 100 nm or less. When the thickness is 10 nm or less, since quantum levels between the well layers are bound to cause a complicated level formation, the well layers may be spaced apart from each other by 10 nm or more.

A well layer in the active layer 4 is formed of In$_Y$Ga$_{1-Y}$As, a composition ratio Y of In is 0.19, a thickness thereof is 10 nm, and a conductivity type thereof is an I type. The composition ratio Y of In is preferably 0.1 or more to 0.25 or less, and the thickness is preferably 5 nm or more to 15 nm or less.

The upper optical guide layer 5 is formed of Al$_X$Ga$_{1-X}$As, a composition fraction X of Al is 0.1, a thickness thereof is 10 nm, a conductivity type thereof is an I type, and an impurity concentration thereof is $1 \times 10^{16}$ cm$^{-3}$ or less. A composition fraction X of Al is preferably 0.1 or more and less than or equal to a barrier layer composition, the thickness is preferably 0 nm or more and 300 nm or less, and the impurity concentration is preferably $1 \times 10^{16}$ cm$^{-3}$ or less.

The carrier barrier layer CB is formed of Al$_X$Ga$_{1-X}$As, the composition fraction X of Al is 0.4, a thickness thereof is 25 nm, a conductivity type thereof is an I type, and an impurity concentration thereof is $1 \times 10^{16}$ cm$^{-3}$ or less. The composition fraction X of Al is preferably 0.3 or more and a cladding layer composition or less, the thickness is preferably 10 nm or more and 100 nm or less, and the impurity concentration is preferably $1 \times 10^{16}$ cm$^{-3}$ or less.

A base layer 6A of the diffraction grating layer 6 is formed of GaAs, a composition fraction X of Al is 0, a thickness thereof is 300 nm, a conductivity type thereof is an I type, and an impurity concentration thereof is $1 \times 10^{16}$ cm$^{-3}$. The composition fraction X of Al is preferably 0 or more to 0.3 or less, the thickness is preferably 100 nm or more and 400 nm or less, and the impurity concentration is preferably $1 \times 10^{16}$ cm-3 or less.

The different-refractive-index region 6B of the diffraction grating layer 6 is formed of Al$_X$Ga$_{1-X}$As, the composition fraction X of Al is 0.4, a thickness thereof is 200 nm, a conductivity type thereof is an I type or a P type, and an impurity concentration in the case of the P type is $1 \times 10^{18}$ cm$^{-3}$. The composition fraction X of Al is preferably 30% or more, the thickness is preferably 100 nm more and 300 nm or less, and the impurity concentration is preferably $1 \times 10^{18}$ cm$^{-3}$ or less.

The upper cladding layer 7 is formed of Al$_X$Ga$_{1-X}$As, the composition fraction X of Al is 0.4, a thickness thereof is 2 μm, a conductivity type thereof is a P type, and an impurity concentration thereof is $1 \times 10^{18}$ cm$^{-3}$. The composition fraction X of Al is preferably 0.3 or more, the thickness is preferably 1 μm or more and 3 μm or less, and the impurity concentration is preferably $1 \times 10^{17}$ cm$^{-3}$ or more and $1 \times 10^{19}$ cm$^{-3}$ or less.

The contact layer 8 is formed of GaAs, a composition fraction X of Al is 0, a thickness thereof is 200 nm, a conductivity type thereof is a P type, and an impurity concentration thereof is $1 \times 10^{20}$ cm$^{-3}$. The composition fraction X of Al is preferably 0, the thickness is preferably 50 nm or more and 500 nm or less, and the impurity concentration is preferably $1 \times 10^{19}$ cm$^{-3}$ or more and $1 \times 10^{20}$ cm$^{-3}$ or less.

For the insulating film 9, silicon nitride (SiNx), silicon dioxide (SiO$_2$), or the like may be used.

Further, for a material of the lower electrode E1, the material capable of ohmic contact with the material of the semiconductor substrate 1, such as AuGe/Au, may be used since the material of the semiconductor substrate 1 is the first conductivity type (N type).

For a material of the upper electrode E2, a material capable of ohmic contact with the material of the contact layer, such as Ti/Au, Ti/Pt/Au, or Cr/Au may be used since the material of the contact layer is the second conductivity type (P type).

In the above-described structure, various configurations may be adopted for a material system, a film thickness, and a layer as long as the configurations include the active layer 4 and the diffraction grating layer 6. Further, in the manufacturing of the semiconductor laser element, it is preferable for a metal organic chemical vapor deposition (MOCVD) method to be used for growth of each compound semiconductor layer. In the above-described crystal growth, first, crystal growth on a (001) plane of the semiconductor substrate 1 is performed, but the present invention is not limited thereto. Further, in the manufacturing of a semiconductor laser element using AlGaAs, a growth temperature of AlGaAs is 500° C. to 850° C., and TMA (trimethylaluminium) may be used as an Al raw material at the time of growth, TMG (trimethylgallium) and TEG (triethylgallium) may be used as a gallium raw material, AsH$_3$ (arsine) may be used as a raw material, Si$_2$H$_6$ (disilane) may be used as a raw material for an N-type impurity, and DEZn (diethylzinc) or the like may be used as a raw material of a P-type impurity. If necessary, the insulating film covering the substrate surface may be formed using a plasma CVD (PCVD) method.

That is, in the semiconductor laser element described above, an N-type cladding layer (AlGaAs) 2, a lower optical guide layer (AlGaAs) 3, an active layer 4 with a multiple quantum well structure (InGaAs/AlGaAs), an upper optical guide layer (AaGaAs) 5, a carrier barrier layer (AlGaAs) CB, and a base layer (GaAs) 6A of the diffraction grating layer are sequentially epitaxially grown on the N type of semiconductor substrate (GaAs) 1 using epitaxial growth (MOCVD).

Then, the base layer 6A of the diffraction grating layer is coated with a resist, and a one-dimensional or two-dimensional fine pattern is drawn and developed on the resist in an electron beam drawing device to form a one-dimensional or a two-dimensional fine pattern that is a diffraction grating on a resist. Thereafter, using the resist as a mask, a two-dimensional fine pattern having a depth of about 100 to 300 nm is transferred onto the base layer 6A using dry etching to form holes, and the resist is removed. Then, the different-refractive-index region (AlGaAs) 6B, the upper cladding layer (AlGaAs) 7, and the contact layer (GaAs) 8 are sequentially formed using an MOCVD method, and an appropriate electrode material is formed on upper and lower surfaces of the substrate using vapor deposition to form first and second electrodes. Further, if necessary, an insulating film can be formed on the upper and lower surfaces of the substrate using a plasma CVD (PCVD) method or the like. In electron beam drawing, a hard mask of such as SiN or $SiO_2$ may be interposed instead of the resist mask.

Further, the carrier barrier layer CB may be omitted, and a position thereof can be changed to an appropriate position in the upper optical guide layer 5.

Figure 3A:
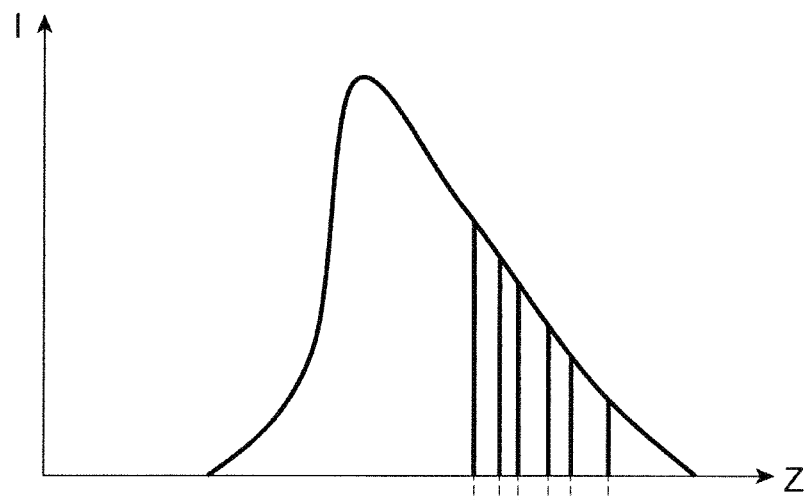
FIG. 3A is a graph showing a relationship between a Z-axis direction position and optical field intensity I.
Figure 3B:
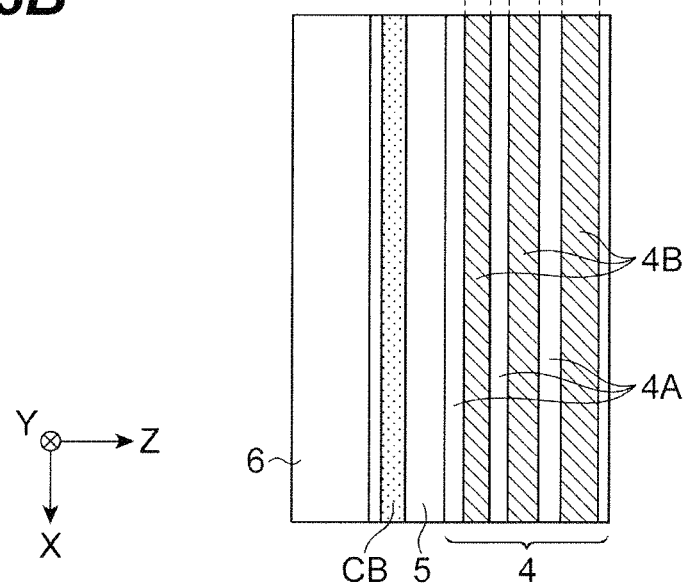
FIG. 3B is a view illustrating an XZ cross-sectional structure near an active layer.

FIG. 3A is a graph showing a relationship between a Z-axis direction position and optical field intensity I, and FIG. 3B is a view illustrating an XZ cross-sectional structure near the active layer.

In this case, the multiple quantum well structure of the active layer 4 includes well layers 4B having different widths of at least two types, and three types in this example. The number of well layers 4B with different widths may be four or more. The active layer 4 includes a well layer 4B, and a barrier layer 4A adjacent to the well layer 4B. A width of the barrier layer between the well layers is made 10 nm or more in order to avoid binding of quantum levels between the spaced apart well layers 4B.

Further, a peak position of the optical field intensity I is closer to the diffraction grating layer 6 than to the active layer 4. As a distance from the diffraction grating layer 6 decreases, a thickness of the well layer 4B decreases. In other words, the thickness of the well layer 4B increases as a distance from the diffraction grating layer 6 increases. Since the thickness of the well layer 4B increases as a distance from the diffraction grating layer 6 increases, optical confinement factors in each well layer are uniformized, and a gain spectrum corresponding to the well layer 4B of each wavelength is stabilized. Since stable gain spectrums having different peak wavelengths are generated corresponding to the plurality of well layers 4B, any one of the gain spectrums and a selected spectrum including a wavelength (energy band end wavelength) selected by the diffraction grating layer 6 can match even when a temperature change occurs, and dependence of the emission spectrum on temperature caused by overlapping of the spectra can also be reduced.

Figure 12A:
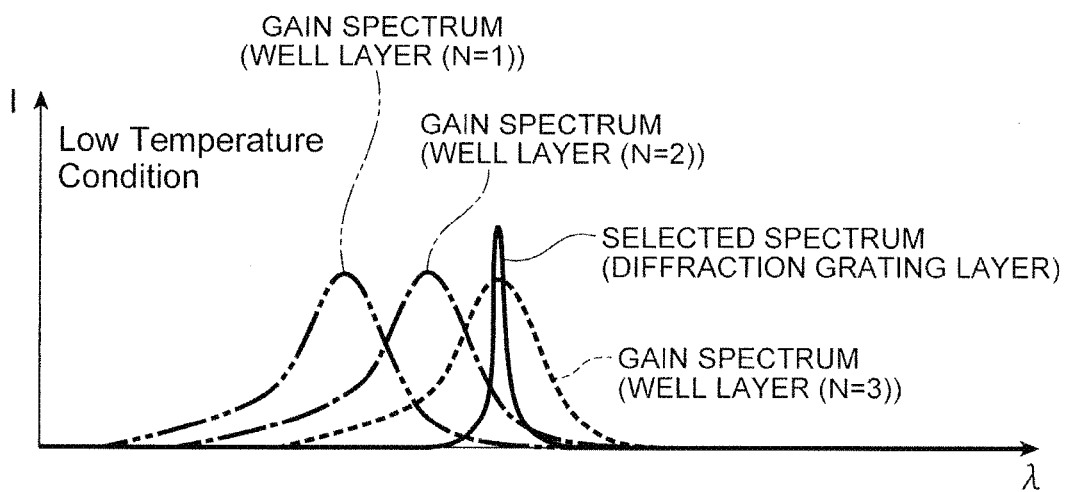
FIG. 12A is a graph of a spectrum at low temperature.
Figure 12B:
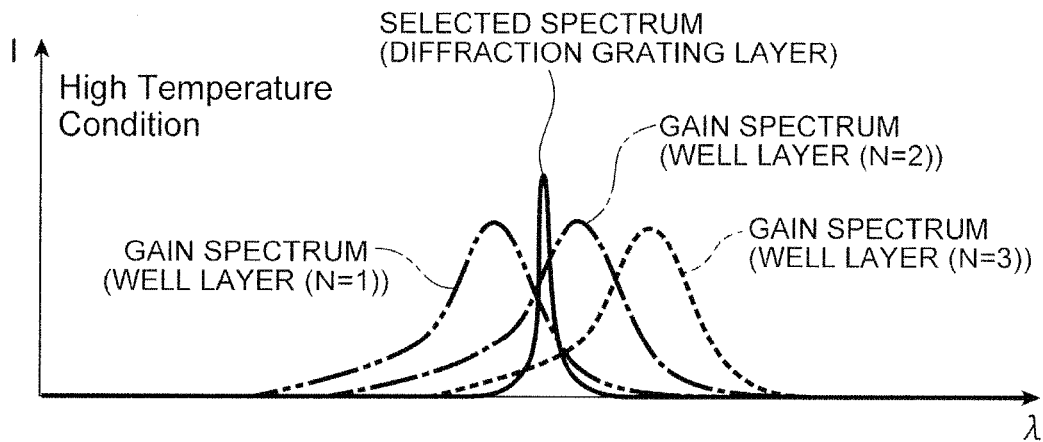
FIG. 12B is a graph of a spectrum at high temperature.

FIG. 12A is a graph of a schematic spectrum at low temperature, and FIG. 12B is a graph of a schematic spectrum at high temperature. For example, when there are three well layers 4B as described above, light with a gain spectrum according to a band gap of the well layers 4B is generated.

It is assumed that N is a natural number, and a thickness of the N-th well layer from the diffraction grating layer 6 among the plurality of well layers 4B is d(N). If the well layers 4B are three layers, N=1, N=2, and N=3, and a gain spectrum of band edge emission is obtained from each of the well layers. Light generated in the well layers 4B is optically coupled to the diffraction grating layer 6, and light in a specific selected spectrum portion resonates according to characteristics of the diffraction grating layer 6 and is thereby amplified.

At low temperature, if N=3 (the well layer farthest from the diffraction grating layer) and the selected spectrums overlap as illustrated in FIG. 12A, laser light with the selected spectrum is obtained and, for example, the distribution of optical field intensity I as illustrated in FIG. 3A can be obtained in the semiconductor laser element.

Further, at high temperature at the time of the low temperature+40° C.), if N=2 (a middle well layer among the three well layers) and the selected spectrum most greatly overlaps as illustrated in FIG. 12B, laser light with this selective spectrum can be obtained and, for example, the distribution of the optical field intensity I as illustrated in FIG. 3A can be obtained in the semiconductor laser element.

For a movement of the wavelength $\lambda$ in this example, the gain peak wavelength moves at 0.3 nm/K, and the band edge wavelength increases at 0.07 nm/K.

The optical field intensity I in the DFB semiconductor laser element can be approximated to a quadratic function that is obtained using a least squares method in the active layer 4 when a maximum value of the optical field intensity I is normalized to be 1 in a case in which a position of an upper exposed surface of the contact layer 8 is Z(μm)=0 μm. An example of a case in which a position along a thickness direction of the N-th well layer of example 1 is D(N) and the thickness is d(N) is shown. If a quantum well layer 10 nm of InGaAs with an In composition of 0.19 is formed in the AlGaAs bather layer with the Al composition of 0.4, a central wavelength is about 978 nm. In this case, if film thicknesses of the quantum well layers are 9 nm and 11 nm, central wavelengths are respectively calculated as 967 nm and 987 nm and a change in the central wavelength of about 10 nm with respect to a change of 1 nm in the film thickness of the quantum well layer occurs. Therefore, if the three quantum wells are provided, distribution can be realized in a range of a central wavelength of about 20 nm. An arrangement example in this case (referred to as an arrangement example (A)) is as follows. d(1)=9 nm D(1)=2445 nm d(2)=10 nm D(2)=2490 nm d(3)=11 nm D(3)=2515 nm With this arrangement, it is possible to align the optical confinement factor of each quantum well layer to 0.0155.

When the number of well layers increases, for the thickness d(N) and the distance d(N), the light intensity distribution I in the active layer can be expressed as a linear equation or a quadratic equation, and integral values thereof are set to be equal, such that the light of each quantum well layer and the confinement factor can be aligned.

It is possible to reduce the dependence of the emission spectrum on temperature by satisfying the above-described conditions.

Further, it is preferable for the coupling coefficient κ of the diffraction grating to satisfy a relationship expression below in order to set a resonator length to be tens of to hundreds of μm, for example, if the length is assumed to be 20 μm to 500 μm, from a relationship of κL≈about 1 to 3 in which a uniform mode distribution can be realized.

$$20 \text{ cm}^{-1} \leq \kappa \leq 1000 \text{ cm}^{-1}.$$

In a 2-dimensional DFB structure, according to K. Sakai, et al., "Coupled-Wave Theory for Square-Lattice Photonic Crystal Lasers With TE Polarization," IEEEJ. Quantum Electron. 46, pp. 788-795 (2010), for example, in a square grating type two-dimensional diffraction grating, in order to obtain a uniform mode distribution, a coupling coefficient is set within a range of $1.66<\kappa 1L<13.29$, $0.5<\kappa 3L<4.0$, and if $L=100$ μm, $166\ cm^{-1}<\kappa 1<1329\ cm^{-1}$ and $50\ cm^{1}<\kappa 3<400\ cm^{-1}$.

On the other hand, in K. Hirose, et al., "Watt-class high-power, high-beam-quality photonic-crystal lasers, "Nature Photon. 8, pp. 406-411 (2014), for a structure with $L=200$ μm, a structure in which coupling between higher-order modes is set to two times higher than in Non-Patent Document 1 has been realized, and an output at a level of watts has been realized by setting a coupling coefficient to a large value. As described above, in order to realize uniform two-dimensional resonance in a region of tens of to hundreds of μm, it is preferable for the following relationship expression to be satisfied. (Conditions of $\kappa 1$ and $\kappa 3$)·$100\ cm^{-1} \leq \kappa 1 \leq 5000\ cm^{-1}$·$500\ cm^{-1} \leq \kappa 3 \leq 5000\ cm^{-1}$.

In this case, it is possible to realize one-dimensional and two-dimensional DFB structures that realize stable oscillation with high efficiency, and to provide a structure suitable for miniaturization to hundreds of μm or less.

Example 1

Further, if the refractive index n of the base layer 6A (GaAs) in the diffraction grating layer 6 having a thickness of 300 nm is 3.52, the refractive index n of the different-refractive-index region 6B (AlGaAs) is 3.25, a percentage (filling factor: FF) of an area of the different-refractive-index region 6B in a plan view when viewed in the Z-axis direction of a total area is 50%, the refractive index n of the upper cladding layer 7 (AlGaAs) is 3.25, the refractive index n of the lower cladding layer 2 (AlGaAs) is 3.11, and a total thickness of the active layer 4 having the three well layers with a thickness of 10 nm and the barrier layers, and the upper and lower optical guide layers is 200 rim, the average refractive index of the electromagnetic field core layer is 3.438, but the refractive index of the base layer of the diffraction grating layer 6A is 3.52, and the electromagnetic field mode is biased to the diffraction grating layer. Since a V parameter to be described below is 2.493 and the cut-off value of the V parameter for causing the number of modes in the thickness direction to be 1 is 3.761, single-mode oscillation is ensured.

The optical field intensity I in the DFB semiconductor laser element can be approximated to the following quadratic function that is obtained using a least squares method in the active layer 4 when a maximum value of the optical field intensity I is normalized to be 1 in a case in which a position of the upper exposed surface of the contact layer 8 is $Z(\mu m)=0$ μm.

Using an equation $-8.766Z^2+41.343Z-47.771=0$, the thickness of the well layer thickness is sequentially reset to be as large as 9, 10, 11 nm in an epi-thickness direction from the diffraction grating layer 6. By arranging a start position of the quantum well layer according to the setting of (the above-described arrangement example (A)), the quantum well layers can be aligned with the optical confinement factor of about 0.0155 of each quantum well layer.

In this case, it is possible to reduce the dependence of the emission spectrum on temperature.

Further, for the peak position of the optical field intensity distribution in the DFB semiconductor laser element, it is preferable for a distance from a centroid of the diffraction grating layer 6 to be shorter than a distance from a centroid of the N-th (N=1) well layer. The light intensity in the active layer can be approximated to, for example, a quadratic function and is expressed by the following relationship equation:

$I(Z)=AZ^2+BZ+C$. In this case, if a start position of the N-th well layer is $Z_N$ and a width thereof is $d_N$, an example of an optical confinement factor $\Gamma(N)$ of the N-th well layer satisfies the following relationship equation.

$$\Gamma(N)=(AZ_N^2+BZ_N+C)d_N^2+(AZ+B/2)d_N^2+Ad_N/3$$

The position and the width of the well layers may be determined so that the optical confinement factors of the N-th well layers is uniform. In this case, since the light intensity distribution is biased to the diffraction grating layer 6, the light intensity distribution tends to decrease as a distance from the diffraction grating layer 6 increases in the active layer. Therefore, the width of the quantum well layer increases as the distance from the diffraction grating layer 6 increases.

It is possible to reduce the dependence of the emission spectrum on temperature by satisfying the above-described conditions.

Further, the carrier barrier layer CB that suppresses a movement of carriers between the active layer 4 and the diffraction grating layer 6 is included between the active layer 4 and the diffraction grating layer 6. It is preferable for the carrier barrier layer CB to have a band gap energy higher than that of the upper optical guide layer and lower than that of the upper cladding layer.

As described above, by shifting the gain peak wavelengths of the plurality of well layers to a longer wavelength, for example, by about 10 nm and arranging the gain peak wavelengths, a change in gain according to a temperature change can be suppressed, and an operation in a broad temperature range is expected. In this case, in the well layer having a gain spectrum with a long wavelength, the well layer thickness increases in a case in which the same well layer material is used. Accordingly, since the optical confinement factor changes, a uniform gain may not be obtained in a broad temperature range according to the arrangement. Since the refractive index of the diffraction grating layer is generally high, an electric field tends to be biased to the diffraction grating layer. However, by arranging the well layer having a greater film thickness and a longer wavelength at a position away from the refractive index modulation layer, it is possible to minimize a variation in the optical confinement factor due to differences between the layer thicknesses and obtain a uniform gain in a broad temperature range.

Example 2

The above-described effects can be realized even when, in the above-described DFB semiconductor laser including the active layer 4 having the multiple quantum well structure including the plurality of well layers 4B of different materials, the diffraction grating layer 6 optically coupled to the active layer 4, and a pair of cladding layers with the active layer 4 and the diffraction grating layer 6 interposed therebetween, the diffraction grating layer 6 includes a layer with a higher refractive index than the average refractive index of the core layer, and the band gap energy defined by a material of the well layer 4B decreases as a distance from the diffraction grating layer 6 increases.

Generally, band gap energy is inversely correlated to a refractive index, and the refractive index tends to increase as the band gap energy decreases. Therefore, there is an effect of the alignment of the optical confinement factor due to increasing the refractive index of the well layer distant from the diffraction grating layer 6 being increased.

It is possible to reduce the dependence of the emission spectrum on temperature by satisfying the above-described conditions.

Figure 4A:
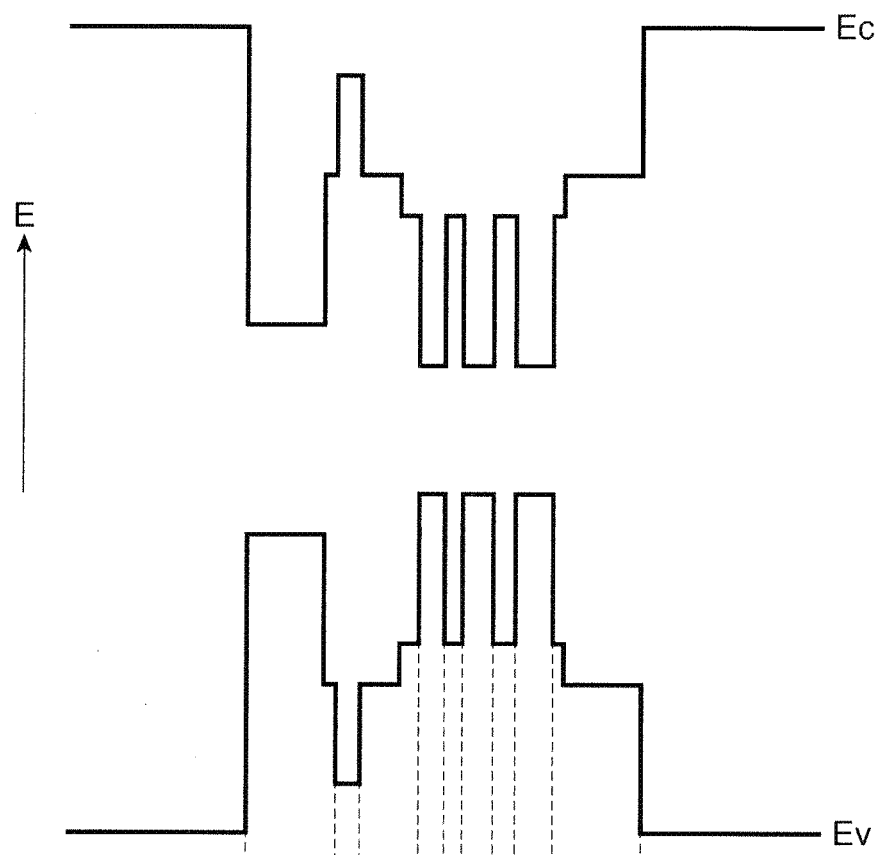
FIG. 4A is an energy band diagram in a DFB semiconductor laser element.
Figure 4B:
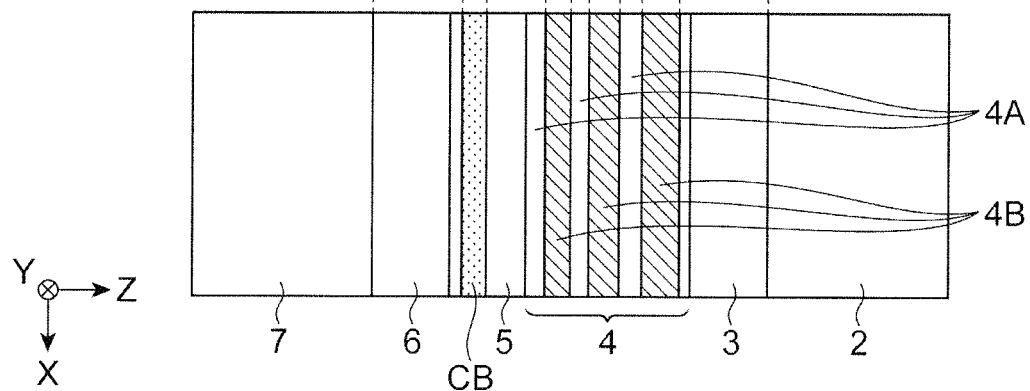
FIG. 4B is a view illustrating an XZ cross-sectional structure.

FIG. 4A is an energy band diagram in the DFB semiconductor laser element, and FIG. 4B is a view illustrating an XZ cross-sectional structure.

In FIG. 4A, a lower end energy Ec of a conduction band and an upper end energy Ev of a valence band are illustrated. If carriers injected from the lower cladding layer 2 and the upper cladding layer 7 are injected into the active layer 4, light is emitted by emission recoupling in the quantum well layer in the active layer 4. In this case, it is possible to suppress leaking of electrons into the diffraction grating layer 6 with a low band gap energy due to the energy barrier of the carrier barrier layer CB and effectively confine the electrons in the vicinity of a light emitting layer.

Figure 5A:
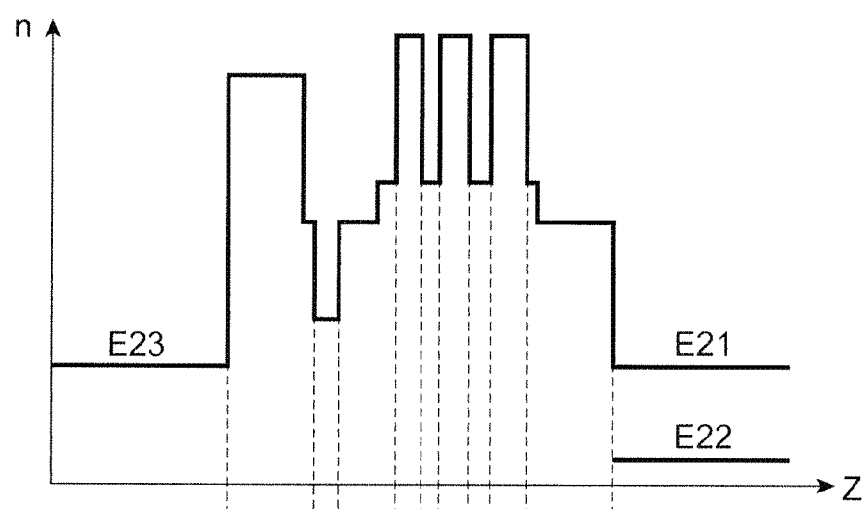
FIG. 5A is a graph showing a relationship between a Z-axis direction position and a refractive index n in a DFB semiconductor laser element.
Figure 5B:
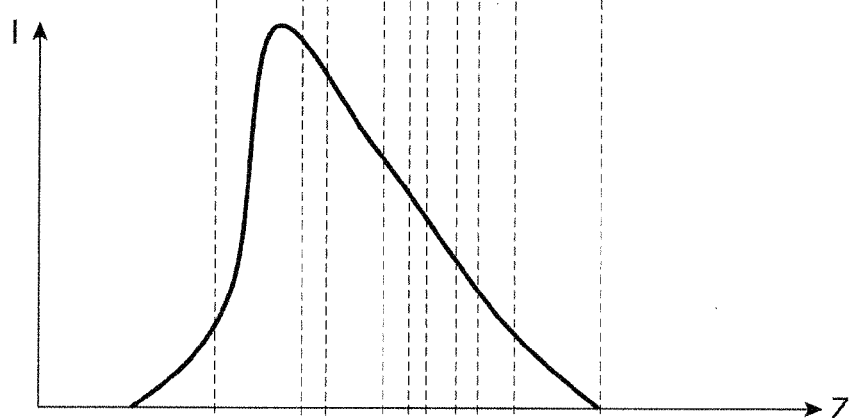
FIG. 5B is a graph showing a relationship between a Z-axis direction position and optical field intensity I.
Figure 5C:
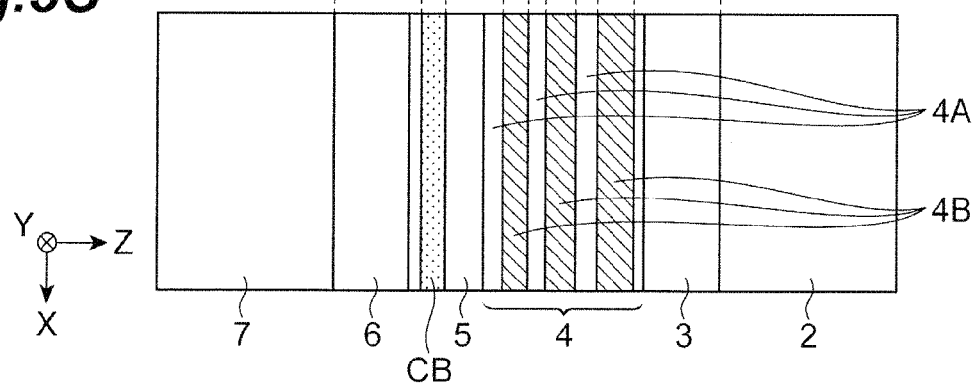
FIG. 5C is a view illustrating an XZ-cross-sectional structure.

FIG. 5A is a graph showing a relationship between the Z-axis direction position and the refractive index n in the DFB semiconductor laser element, FIG. 5B is a graph showing a relationship between the Z-axis direction position and the optical field intensity I, and FIG. 5C is a view illustrating the XZ cross-sectional structure.

The refractive index n is inversely correlated to a level of the lower energy Ec of the conduction band. When the refractive index increases, light is easily confined and the peak of the optical field intensity is distributed near the diffraction grating layer 6 with a high refractive index. Light generated in the active layer 4 is optically coupled to the inside of the diffraction grating layer 6, and light waves with a specific wavelength and a wavenumber vector are selected. In this case, it is possible to obtain single-mode oscillation by setting a V parameter defined by a thickness of each layer and dimensions of the diffraction grating to satisfy a single-mode condition.

An energy level E21 or E22 at a lower end of the conduction band of the lower cladding layer 2 may be the same as or may be different from an energy level E23 at a lower end of the conduction band of the upper cladding layer 7. The refractive index of the lower cladding layer 2 may be smaller than that of the upper cladding layer 7 by adopting the energy level E22. In this case, there is an effect that the optical field is biased to the diffraction grating layer 6 with respect to the active layer 4 since the optical field distribution is biased to the upper cladding layer with respect to the active layer.

Since a material refractive index of a base layer of the diffraction grating layer 6 is higher than an average refractive index of the core layer, the optical field is biased to the diffraction grating layer 6.

Various examples of the refractive index distribution can be conceived.

Figure 6A:
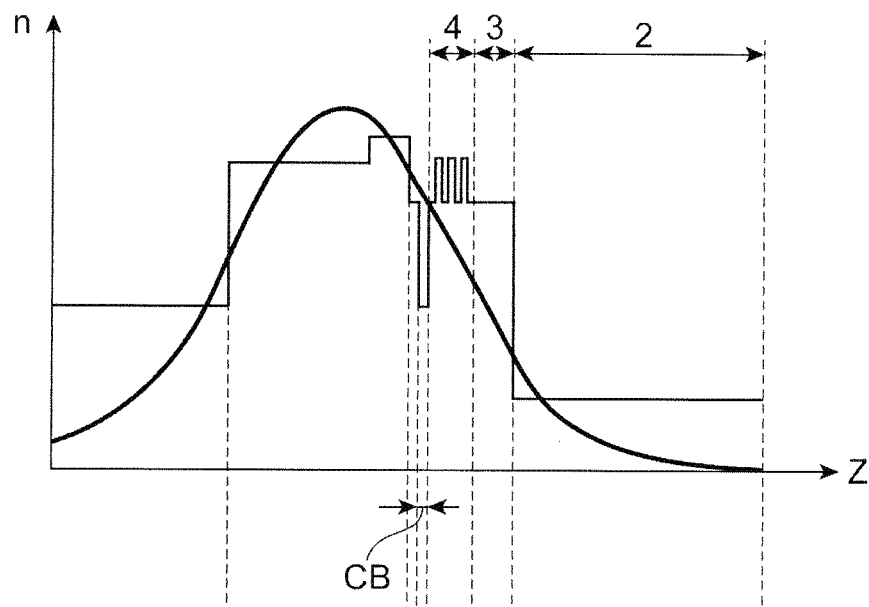
FIGS. 6A and 6B are graphs showing a relationship between a Z-axis direction position and a refractive index n in DFB semiconductor laser elements having different refractive index distribution structures.
Figure 6B:
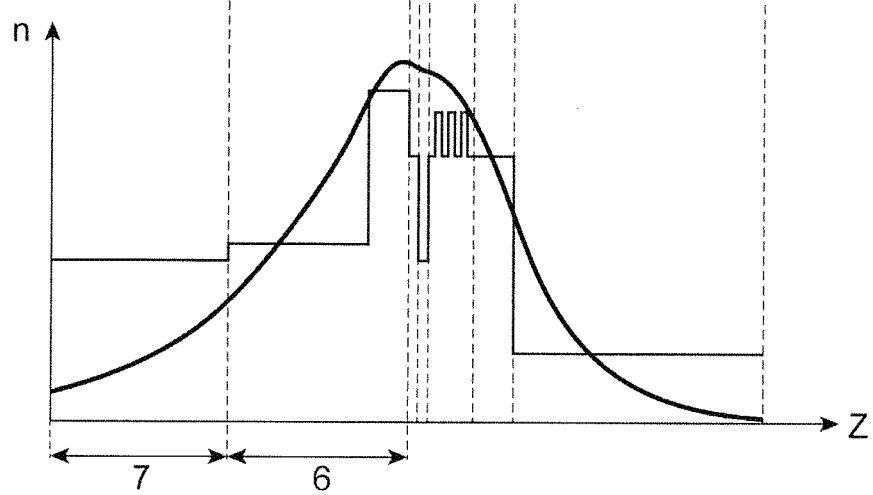

FIGS. 6A and 6B are graphs showing a relationship between a Z-axis direction position and a refractive index n in DFB semiconductor laser elements having other refractive index distribution structures.

FIG. 6A illustrates an example of a refractive index distribution in which a structure of the diffraction grating layer 6 includes a base layer 6A (GaAs) and a different-refractive-index region (AlGaAs), as described above.

FIG. 6B illustrates an example of a refractive index distribution in which the structure of the diffraction grating layer 6 includes the base layer 6A (GaAs) and a different-refractive-index region (air). Conditions are the same as in FIG. 13 except that the refractive index n of the base layer 6A (GaAs) in the diffraction grating layer 6 having a thickness of 300 nm is 3.52, the refractive index n of the different-refractive-index region 6B (air) is 1, and a percentage (filling factor FF) of an area of the refractive index region 6B in a plan view when viewed in the Z-axis direction in a total area is 15%. A V parameter to be described below is 2.314, and a cutoff value of the V parameter for causing the number of modes in the thickness direction to be 1 is 3.811.

Since the refractive index of the base layer of the diffraction grating layer 6 is 3.52 and higher than the average refractive index neff=3.391 of the core layer, the optical field is biased to the diffraction grating layer.

The optical field intensity I in the DFB semiconductor laser element can be approximated to the following quadratic function that is obtained using a least squares method in the active layer 4 when a maximum value of the optical field intensity I is normalized to be 1 in a case in which a position of the upper exposed surface of the contact layer 8 is $Z(\mu m)=0$ μm.

$$-13.324Z^2+64.423Z-76.875=0$$

Therefore, in this case, it is possible to reduce the dependence of the emission spectrum on temperature by increasing the thickness of the quantum well layers to 9, 10, and 11 nm as the distance from the diffraction grating layer 6 increases and arranging the integral values so that the integral values are aligned.

Example 3

When the diffraction grating layer 6 in FIG. 2 is inverted in a vertical direction, the base layer 6A is located in an upper portion of the different-refractive-index region 6B. In this case, the different-refractive-index region 6B that has been embedded is formed of AlGaAs in the same manner as above, and other conditions are the same as in FIG. 13.

The refractive index n of the base layer 6A (GaAs) in the diffraction grating layer 6 having a thickness of 300 nm is 3.52, the refractive index n of the different-refractive-index region 6B (AlGaAs) is 3.25, a percentage (filling factor: FF) of an area of the refractive index region 6B in a plan view when viewed in the Z-axis direction in a total area is 50%, the refractive index n of the upper cladding layer 7 (AlGaAs) is 3.25, the refractive index n of the lower cladding layer 2 (AlGaAs) is 3.11, and a total thickness of the active layer 4 having the three well layers with a thickness of 10 nm and the barrier layers, and the upper and lower optical guide layers is 200 nm. The V parameter to be described below is 2.493, and the cutoff value of V parameter for causing the number of modes in the thickness direction to be 1 is 3.761. In this case, since the average refractive index of the core layer is 3.438 and lower than the refractive index of the base layer of the diffraction grating layer 6, the optical field is biased to the diffraction grating layer 6.

The optical field intensity I in the DFB semiconductor laser element can be approximated to the following quadratic function that is obtained using a least squares method in the active layer 4 when a maximum value of the optical field intensity I is normalized to be 1 in a case in which a position of the upper exposed surface of the contact layer 8 is $Z(\mu m)=0$ μm.

$$-10.096Z^2+48.292Z-56.847=0$$

Accordingly, it is possible to reduce dependence of the emission spectrum on temperature by setting the thicknesses of the quantum well layers to large values such as 9, 10, and 11 nm as a distance from the diffraction grating layer 6 increases and arranging the quantum wells so that the above integral values are aligned.

FIG. 7A is an energy band diagram in the DFB semiconductor laser element in which a depth of the well layers has been changed, and FIG. 7B is a view illustrating an XZ cross-sectional structure.

That is, an example in FIGS. 7A and 7B is obtained by changing a depth of the well of each well layer 4B in the structure illustrated in FIGS. 4A and 4B, and other points thereof are the same as in FIGS. 4A and 4B. If a composition ratio of In in the well layer 4B is changed, the band gap energy is changed. If the composition ratio of In is increased, the band gap energy Eg is decreased, and if the composition ratio of In is decreased, the band gap energy Eg is increased. Since the band gap energy of GaAs is 1.47 eV and the band gap energy of InAs is 0.36 eV, the energy band gap of InGaAs has a value therebetween.

Further, the refractive index of GaAs is 3.6 at a wavelength of about 900 nm, and the refractive index of InAs is about 3.7. The refractive index of AlAs is 3.0 at a wavelength of about 900 nm.

In the case of a structure of FIGS. 7A and 7B, band gap energy of the well layer 4B decreases (a composition ratio of In increases) and a depth of the potential well increases as a distance from the diffraction grating layer 6 increases. In this case, as the band gap energy decreases, the refractive index tends to increase. Accordingly, the optical confinement factor is aligned by increasing the refractive index of the well layer distant from the diffraction grating layer 6.

Figure 8A:
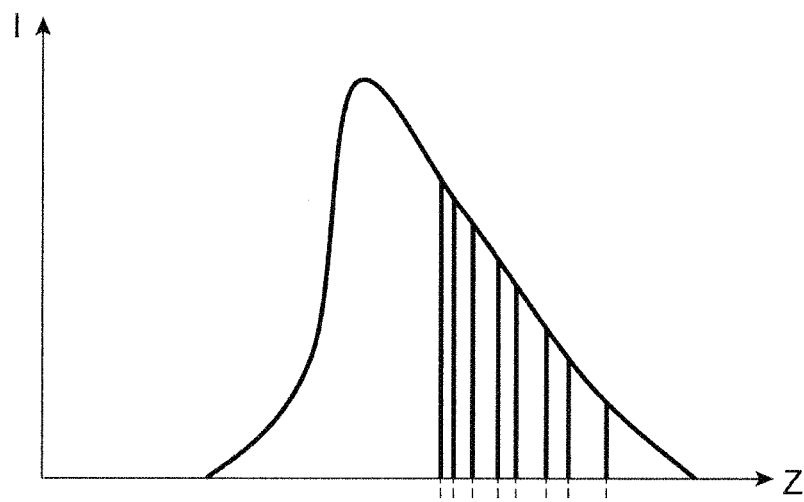
FIG. 8A is a graph showing a relationship between a Z-axis direction position and optical field intensity I in a DFB semiconductor laser element including four well layers.
Figure 8B:
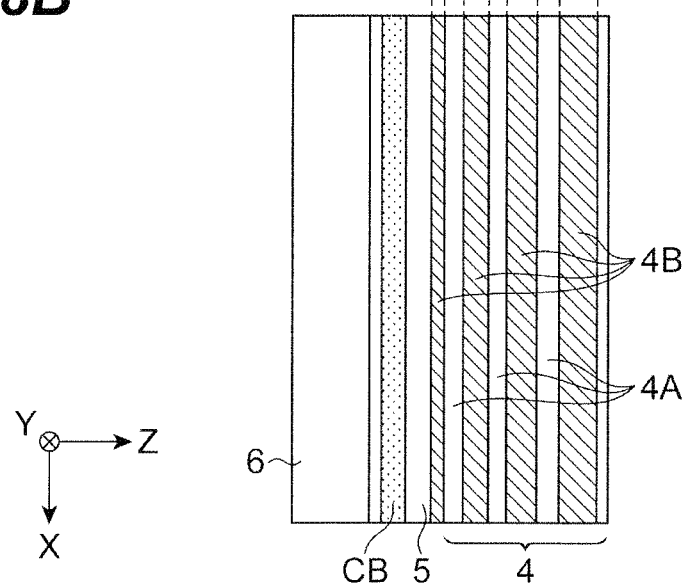
FIG. 8B is a view illustrating an XZ cross-sectional structure near an active layer.

FIG. 8A is a graph showing a relationship between the Z-axis direction position and the optical field intensity I in a DFB semiconductor laser element having four well layers, and FIG. 8B is a view illustrating an XZ cross-sectional structure near the active layer.

That is, in the structure illustrated in FIGS. 3A and 3B, the active layer having the three well layers 4B are illustrated, whereas in an example of FIGS. 8A and 8B, the number of well layers 4B is 4, and other points are the same. The number of well layers 4B may be four or more. In this case, since the number of emission spectra from each well layer 4B increases, a change in the emission spectra with respect to a temperature change can be further reduced.

(2) Surface-Emitting Type DFB Semiconductor Laser Element

Figure 9A:
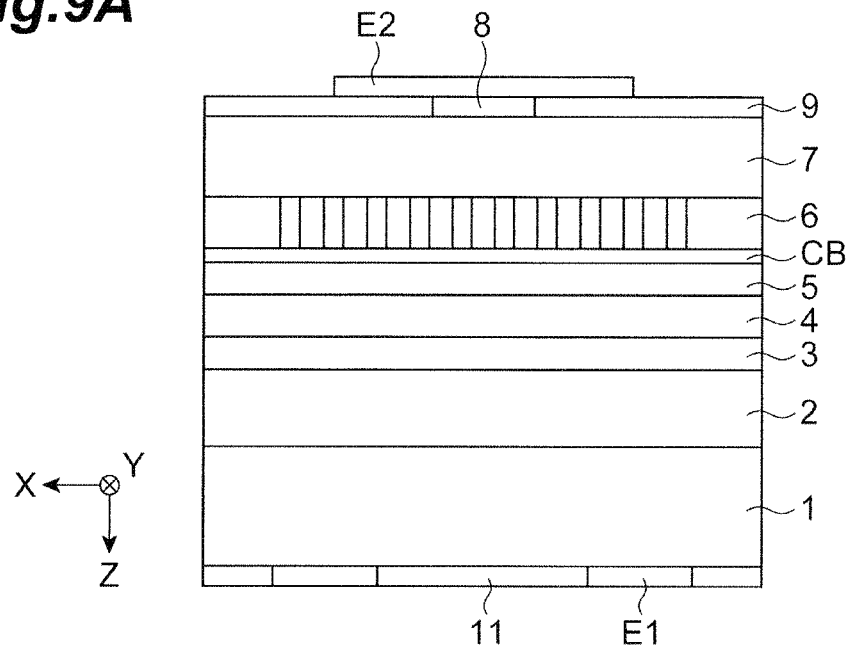
FIG. 9A is a view illustrating an XZ cross-sectional structure of a DFB semiconductor laser element having another structure.
Figure 9B:
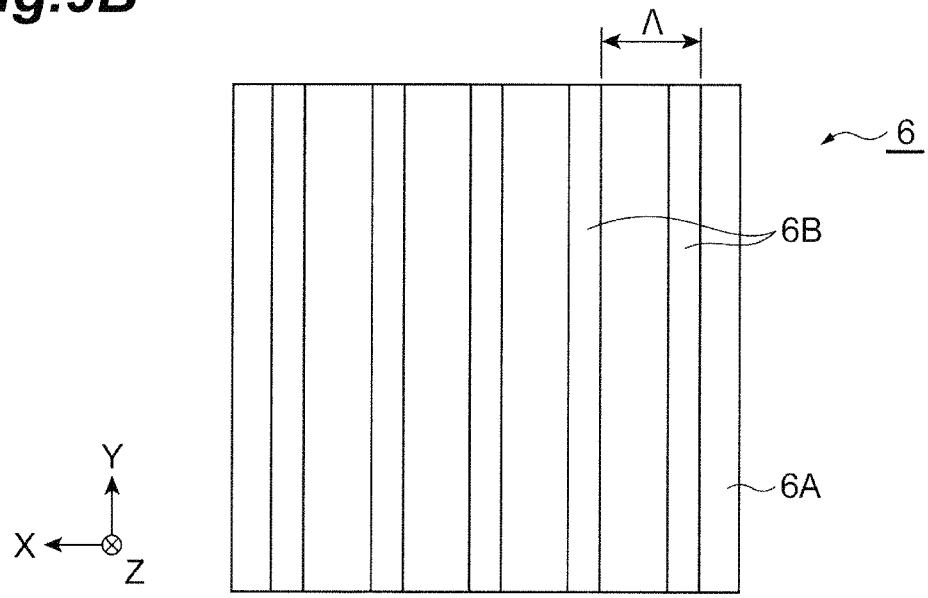
FIG. 9B is a view illustrating a planar structure of a diffraction grating layer.

FIG. 9A is a view illustrating an XZ cross-sectional structure of a DFB semiconductor laser element having another structure, and FIG. 9B is a view illustrating a planar structure of the diffraction grating layer.

This is different from the above-described edge emitting type DFB semiconductor laser element in that a planar structure of the diffraction grating layer 6, and the mesa stripe structure in an upper portion are not formed, and is the same in other points. The above-described structure can be adopted for a cross-sectional structure of the diffraction grating layer 6 and a structure of the active layer 4.

When this DFB semiconductor laser element 100 is manufactured, a lower cladding layer 2 formed of a first conductivity type (N-type) of AlGaAs, a lower optical guide layer 3 formed of AlGaAs, an active layer 4 having a multi-quantum well (MQW) structure (barrier layer: AlGaAs and well layer: InGaAs), an upper optical guide layer 5 formed of AlGaAs, an optional carrier barrier layer CB, and a diffraction grating layer 6 (refractive index modulation layer) formed of GaAs are produced by crystal growth on a semiconductor substrate I formed of the first conductivity type (N-type) of GaAs using a metal organic vapor phase epitaxy (MOCVD) method or a molecular beam epitaxy (MBE) method.

Then, a one-dimensional stripe structure is formed on a surface of the diffraction grating layer 6 using a microfabrication technology. In this case, as illustrated in FIG. 9, a grating period Λ is set so that an optical length thereof is a length corresponding to one wavelength of the laser light (Λ=λ) to correspond to a second-order diffraction grating. That is, the diffraction grating layer 6 is originally an grown layer in which the formed base layer 6A (GaAs) is processed in a stripe shape using a photolithography technology, and a material having a refractive index different from that of the base layer 6A, for example, the different-refractive-index region 6B formed of AlGaAs is embedded in gaps between the stripes using an MOCVD method. Each stripe extends in a direction of the resonator length (Y-axis direction), and the thickness of the different-refractive-index region 6B is set to be smaller than that of the base layer 6A, but these may have the same thickness. For example, laser light in 940, 980, and 1060 nm bands as the emission wavelengths can be adopted.

Figure 10A:
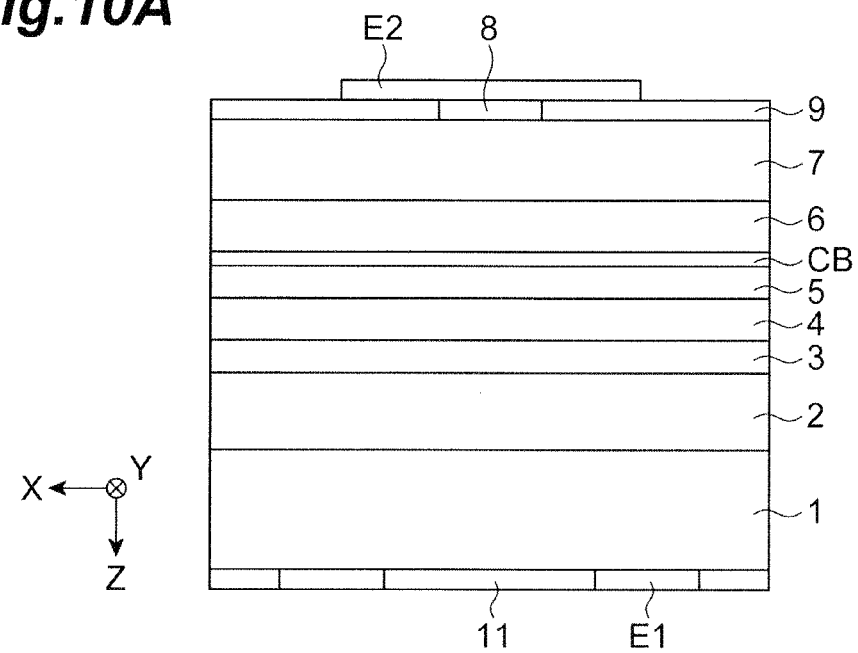
FIG. 10A is a view illustrating an XZ cross-sectional structure of a DFB semiconductor laser element having another structure.
Figure 10B:
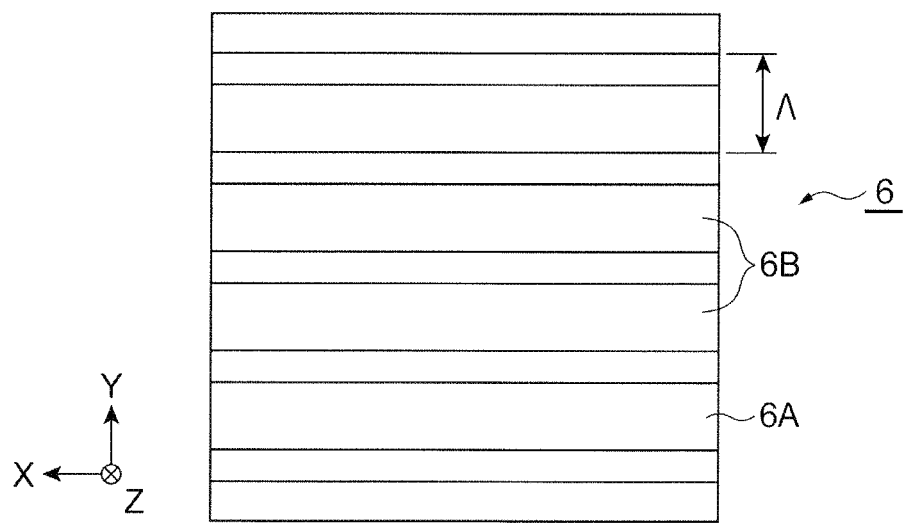
FIG. 10B is a view illustrating a planar structure of the diffraction grating layer.

A direction of extension of the stripe may be an X-axis direction as illustrated in FIGS. 10A and 10B, or may be an arbitrary direction in an XY plane. The semiconductor laser element illustrated in FIGS. 10A and 10B is obtained by rotating the diffraction grating layer 6 of the semiconductor laser element illustrated in FIGS. 9A and 9B by 90° about the Z axis, and the other points thereof are the same as in the semiconductor laser element illustrated in FIGS. 9A and 9B.

Subsequently, the upper cladding layer 7 formed of a second conductivity type (P-type) of AlGaAs and the contact layer 8 formed of a second conductivity type (P-type) of GaAs are produced by crystal growth on the diffraction grating layer 6 using an MOCVD method. The upper cladding layer 7 may be formed subsequently to the process of forming the different-refractive-index region 6B in the diffraction grating layer 6. Air or an inert gas may be used as the different-refractive-index region 6B in the diffraction grating layer 6 or the different-refractive-index region 6B may be in a vacuum state.

Subsequently, an antireflection film 11 formed of SiNx or the like is formed on the lower surface of the semiconductor substrate 1, the antireflection film 11 is patterned using a photolithography technology to remove a portion thereof, and the lower electrode E1 of which a central area in a plan view when viewed in the Z-axis direction is open is formed in this removed portion. The lower electrode E1 is physically and electrically connected to the semiconductor substrate 1 and has an opening shape. Therefore, a wavelength of laser light generated near the active layer is selected by the diffraction grating layer 6 and the laser light is output in the Z-axis direction through the inside of the opening of the lower electrode E1.

Further, a peripheral portion of the contact layer 8 is etched through patterning using a photolithography technology so that only a central region thereof is left. The insulating film 9 for protection is formed to cover an exposed surface of the contact layer 8. The insulating film 9 on the contact layer 8 is removed by etching to expose the contact layer 8 and the upper electrode E2 is formed to come in contact with the contact layer 8. For a method of forming the lower electrode E1 and the upper electrode E2, a vapor deposition method or a sputtering method may be used.

A carrier barrier layer CB can be formed between the active layer 4 and the diffraction grating layer 6 using an MOCVD method or an MBE method. The carrier barrier layer CB suppresses the movement of carriers between the active layer 4 and the diffraction grating layer 6. In this example, the carrier barrier layer CB is formed of AlGaAs and provided in the upper optical guide layer 5. Band gap energy of the carrier barrier layer CB is higher than the upper optical guide layer 5 and lower than the upper cladding layer 7.

Thereafter, the compound semiconductor substrate is cleaved into a chip that is a semiconductor laser element to a length of an interval of about 1 to 3 mm in a Y-axis direction.

Then, the upper electrode E2 of the semiconductor laser element is mounted on a sub-mount with a solder material, and then, the sub-mount is die-bonded to a base using a solder material. For both of the solder materials, In, Au/Sn, or the like may be used. A lower opening electrode E1 is connected to the base electrode by wire bonding such as an Au wire, such that current driving can be realized. In the above process, the semiconductor laser element unit is formed.

Materials, impurity concentrations, thicknesses, and the like of the respective compound semiconductor layers are the same as those described with reference to FIGS. 1 to 10.

(3) DFB Photonic Crystal Semiconductor Laser Element

Figure 11A:
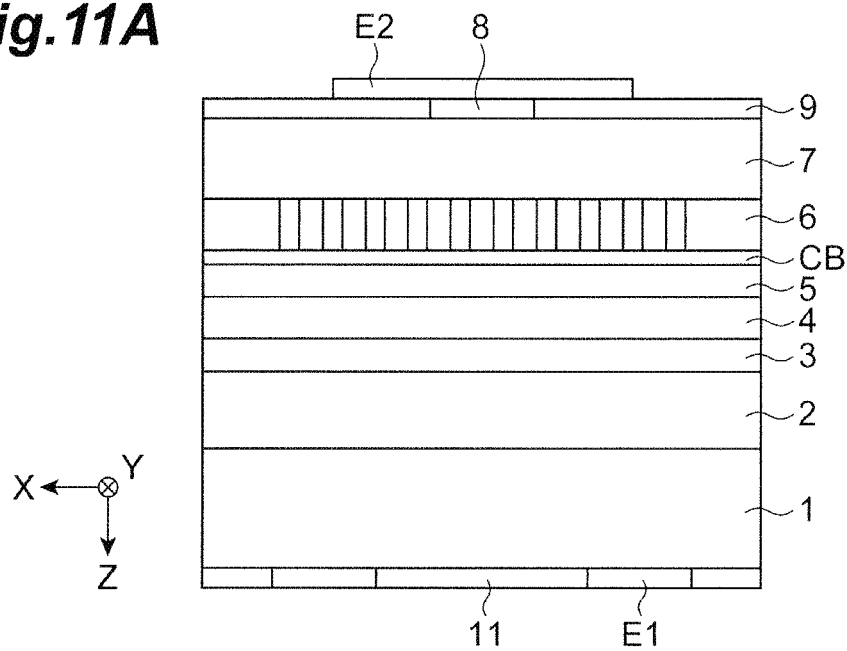
FIG. 11A is a view illustrating an XZ cross-sectional structure of a DFB semiconductor laser element having another structure.
Figure 11B:
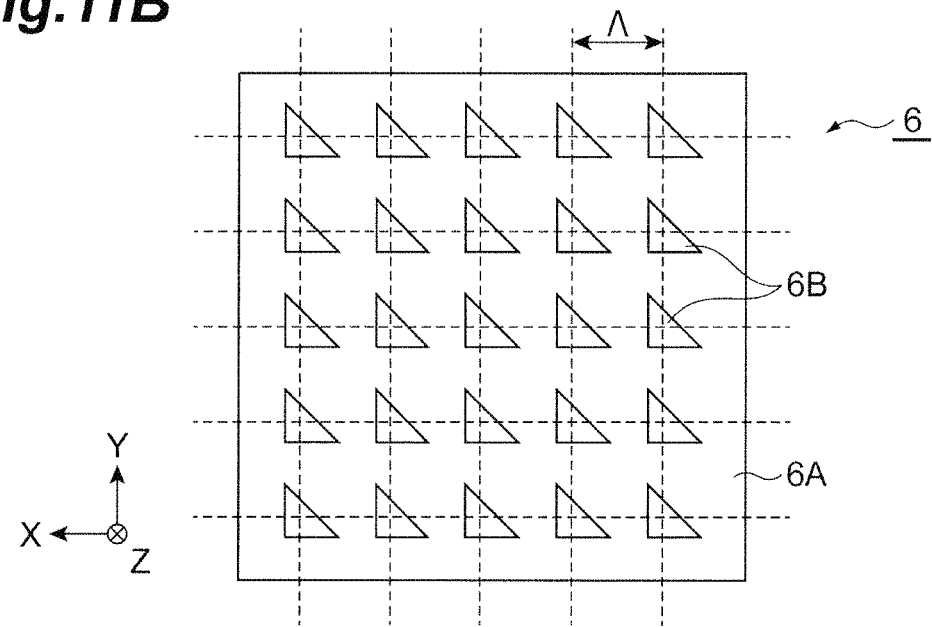
FIG. 11B is a view illustrating a planar structure of the diffraction grating layer.

FIG. 11A is a view illustrating an XZ cross-sectional structure of a DFB semiconductor laser element having another structure, and FIG. 11B is a view illustrating a planar structure of the diffraction grating layer.

The DFB semiconductor laser element illustrated in FIGS. 11A and 11B is different from that illustrated in FIGS. 9A and 9B or FIGS. 10A and 10B in only a two-dimensional pattern of the diffraction grating layer 6, and is the same in other configurations. In the diffraction grating layer 6 of this example, the different-refractive-index region 6B is arranged at a grating point position on the two-dimensional square grating, this diffraction grating layer 6 constitutes a so-called photonic crystal, the DFB semiconductor laser element forms a photonic crystal laser (PCSEL), and an output is obtained in the Z-axis direction. Although the planar shape of the different-refractive-index regions 6B is a right-angled isosceles triangle, another triangular shape, a polygonal shape such as a four or more angled shape, or a circular shape may be adopted. A grating interval Λ can be set so that the optical length corresponds to one wavelength of the laser light according to a second-order diffraction grating (Λ=neff×λ, neff: equivalent refractive index). Preferably, λ=290 nm is set to obtain laser light with a wavelength of λ=about 980 nm.

As described above, in the DFB semiconductor laser element described above, the coupling coefficient x of the diffraction grating is set to be very high, and diffraction efficiency increases. In this case, in a region having a multi quantum well structure that generates a plurality of wavelengths, a rate of change in field intensity according to the position increases and the emission spectrum becomes highly dependent on temperature. Therefore, in each well layer, a structure in which the optical field intensities (optical confinement factors) are aligned is adopted to uniformize the gain spectrum intensity corresponding to the well layer of each wavelength and increase stability according to temperature change.

In the DFB semiconductor laser element, κL may be used as an index indicating diffraction efficiency. κ is a coupling efficiency, L indicates a resonator length, L is typically on the order of hundreds of μm to several mm, and x is typically a few cm$^{-1}$ to tens of cm$^{-1}$. If κL is set to about 1 to 3 (1≤κL≤3), modes of the optical field inside the resonator can also be uniformed and stable oscillation can also be expected in the structure of the related art.

However, as in the present invention, in the DFB semiconductor laser element with high diffraction efficiency, it is also possible to save space by setting κ to tens of to a hundred cm$^{-1}$. Thus, in order to realize a high κ (for example, 20 cm$^{-1}$≤κ≤1000 cm$^{-1}$), it is necessary for the optical field intensity (optical confinement factor Γg) of a layer including a diffraction grating to be increased, and it is necessary for the peak of the field intensity to be located inside the diffraction grating layer or near the diffraction grating layer.

On the other hand, in order to obtain a sufficient optical gain, it is necessary for the light field intensity (optical confinement factor Γqw) inherent in the quantum well layer to be maintained as a high light field intensity, and it is necessary for a distance between the diffraction grating layer and the quantum well layer to be hundreds of nm or less. In this case, multiple quantum well layer with a multi-wavelength overlaps a region in which a change in the field intensity is abrupt. As a result, as described above, if the structure is not a structure in which the optical field intensities (optical confinement factors Γqw1, Γqw2, . . . ) of respective layers are aligned, unevenness occurs in the gain spectrum intensities corresponding to the well layer of each wavelength, and the structure does not function stably according to the temperature change. Therefore, in the above-described embodiment, a structure in which the well layer becomes thicker as the distance from the diffraction grating layer increases is adopted.

Further, it has been experimentally found that in a photonic crystal laser having a two-dimensional periodic structure, an in-plane mode is stabilized by increasing the coupling coefficient x to hundreds of to thousands of cm$^{-1}$. As described in the above-described (conditions of κ1 and κ3), in the photonic crystal in a square grating arrangement, the coupling coefficient κ1 in a 90° direction is set to about 100 cm$^{-1}$≤κ1≤5000 cm$^{-1}$ and the coupling coefficient κ3 in a 180° direction is set to about 50 cm$^{-1}$≤κ3≤5000 cm$^{-1}$. Therefore, a change in field intensity in the multiple quantum well layer with the multi-wavelength is abrupt, and a structure in which the well layer is thick as a distance from the diffraction grating layer increases works more advantageously for stabilization of the emission spectrum.

The DFB semiconductor laser element according to the embodiment has been described above, but laser light of a single mode is generated in a thickness direction in the above-described structure. As in the structure in FIGS. 11A and 11B, when the laser light has two dimensional spreading, laser light of a basic 0th-order mode and laser light of a high-order first-order mode compete, and oscillation is likely to be caused at an anti-tolerance point of a photonic band. That is, for example, when the position of the different-refractive-index region 6B is on a grating point of a triangular grating, a hexagonal beam may be generated. In the single-mode oscillation, in order to suppress the generation of such a beam pattern, it is preferable for the refractive indexes and the thicknesses of the active layer and the diffraction grating layer to be limited to specific ranges to cause the single-mode oscillation.

Further, since the peak position of the optical field intensity is on the diffraction grating layer side, the optical field intensity of the active layer gradually decreases as the distance from the diffraction grating layer increases. The well layer can cause the optical field intensity I(N) at a position of N and an integration (optical confinement factor Γ(N)=∫I(N)dz: TE mode) in a thickness direction in each well layer to be substantially constant. That is, Γ(N)=constant C±error Δ and an error Δ=C×10% can be set.

That is, when N is a natural number, a thickness of the N-th well layer from the diffraction grating layer among the plurality of well layers is d(N), and the optical confinement factor of the N-th well layer is Γ(N), a relative change in Γ(N) is 10% or less.

In the above-described embodiment, when the quantum well layers have two or more well layer widths (thicknesses), the peak wavelength of the gain spectrum can be changed according to the well layer widths and a plurality of gain spectra having a wavelength width of about 10 nm in a full width at half maximum in a near infrared region can overlap. Accordingly, it is possible to expand a wavelength width of the gain spectrum of the quantum well in comparison with a structure of a single well width and to obtain a broad gain spectrum. Therefore, it is possible to minimize a change in gain spectrum intensity with respect to the change in gain spectrum according to the change in temperature.

Since the laser light of the single mode is generated in the thickness direction of the layer, the competition of a higher order mode can be suppressed and oscillation characteristics with good linearity can be obtained with high efficiency. Further, if a high-order mode is oscillated in a two-dimensional diffraction grating, a specific beam pattern through an anti-tolerance point of the band appears, but this can be suppressed in the single mode oscillation.

Further, in the active layer close to the diffraction grating layer, the optical field distribution approximates to a primary or secondary function, and contributions of diffraction in the respective quantum wells can be equalized by arranging the well layers so that the integral values (optical confinement factors) of the light field distribution are equalized. Therefore, it is possible to suppress a variation in the diffraction effects according to a temperature change.

Conditions for generating a single-mode are known from the document, "Yasuo Kokubun, 'Lightwave Engineering', p 144, Kyoritsu Publishing", and can be obtained from distribution curves (FIG. 14) for a normalized waveguide width V and a normalized propagation constant b.

That is, for example, in the case of a structure in which the diffraction grating layer and the active layer are interposed between a pair of cladding layers, such a layer structure can approximate to a three-layer slab waveguide structure on the assumption that the diffraction grating layer and the active layer are core layers. In this case, the refractive index and the film thickness in which there is only a fundamental mode can be calculated using the following scheme.

An electromagnetic field distribution in such a waveguide structure can be calculated by numerically solving a Maxwell wave equation under boundary conditions. In this case, in an equivalent asymmetrical three-layer slab waveguide structure, if each layer is denoted with number i, a thickness of each layer is w(i), and the dielectric constant is $\in(i)$, an equivalent dielectric constant $\in_{Eq}$ of each layer can be obtained using $\in_{Eq}=\Sigma(w(i)\in(i))/\Sigma w(i)$. A target of addition of $\Sigma$ is from a layer of i=1 to a layer of a last number.

Further, the number of modes in a three-layer asymmetric slab waveguide is characterized by a V parameter and a normalized propagation constant b shown in the following equations.

$$V=k_0 n_1 d(2\Delta)^{0.5}, \text{ and } b=((\beta/k_0)^2-N_2^2)/(n_1^2-N_2^2).$$

Here, $k_0$ is a wavenumber in vacuum, $n_1$ is the refractive index of the lower cladding layer, d is a film thickness of the core layer, Δ is a non-refractive index difference, β is a propagation constant, and $n_2$ is a refractive index of the upper cladding layer.

Further, the V parameter of the three-layer asymmetric slab waveguide has a value that satisfies an eigenvalue equation shown in the following equation (*) with respect to the normalized propagation constant b.

$$V=1/(1-b)^{0.5}[\tan^{-1}\chi^2(b/(1-b))^{0.5}+\tan^{-1}\chi_3((b+a')/(1-b))^{0.5}+K\pi]$$

If a' is an asymmetric parameter, K is an arbitrary positive integer, and refractive indexes of the i-th layer (i=1, i=2, and i=3) are $n_1$, $n_2$, and $n_3$, a result is as follows. i=1 is a lower cladding layer, i=2 is a layer approximating to a core layer between the cladding layers, and i=3 indicates the upper cladding layer.

$$a'=(n_2^2-n_3^2)/(n_1^2-n_2^2)$$

Further, χi is a constant that depends on the TE mode and the TM mode of the i-th layer, and satisfies the following values in the case of the refractive index ni of the i-th layer.

χi=1 (at the time of TE mode),
χi=$(n_1/n_1)^2$ (in a TM mode).

Figure 14:
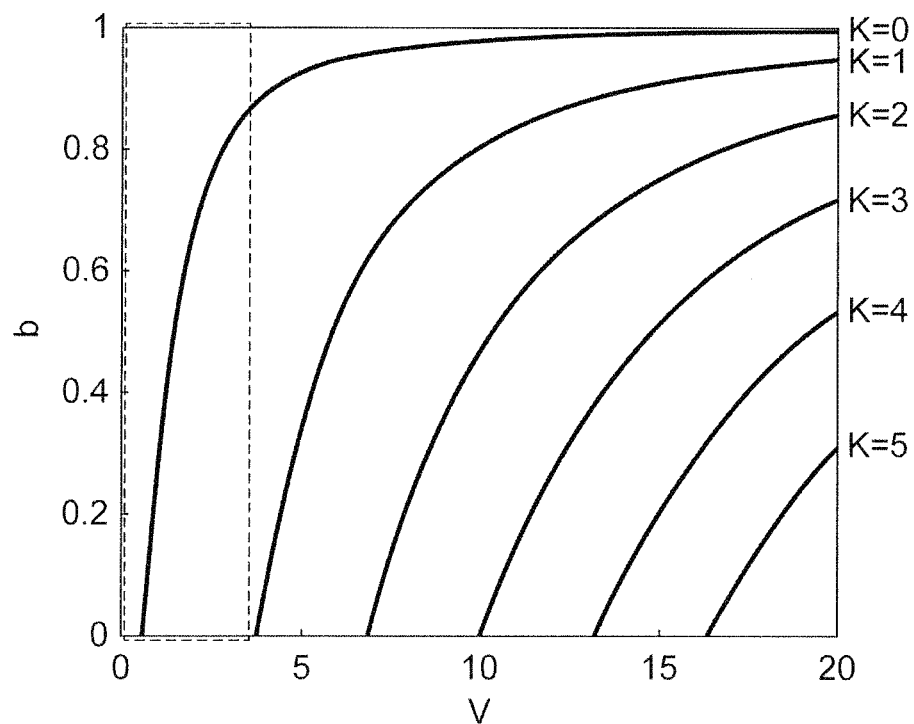
FIG. 14 is a diagram illustrating distribution curves for a normalized waveguide width V and a normalized propagation constant b.

In the structure of Example 1 described above, when the calculation is performed using the wavelength λ=980 nm, the refractive indexes are $n_1$=3.44, $n_2$=3.26, and $n_3$=3.11, and a relationship of V and b satisfying Equation (*) of the V parameter in the TE mode is plotted as illustrated in FIG. 14. In this case, in the range of V surrounded by a dotted line, b is only one solution, and the single-mode is oscillated. From this relationship, the refractive index and the thickness of the diffraction grating layer and the active layer oscillating in the single-mode can be determined. In the above-described (Example 1), since V=2.134 and is smaller than V=3.176 appearing in a first-order mode, the single-mode is oscillated.

Although the DFB semiconductor laser element according to the embodiment has been described above, constituent materials or conductivity types can be variously modified. The band gap energy of the quantum well layer is adjustable using a material composition, distortion, or the like, but the band gap energies of the well layers may be the same or may be different, as described above. Further, P-type is adopted as the first conductivity type and N-type is adopted as the second conductivity type, but the same functions are achieved also when the conductivity types are reversed. Further, the optical guide layer may be omitted in some cases.

As described above, the above-described distributed feedback (DFB) semiconductor laser element includes the active layer 4 having the multiple quantum well (MQW) structure including the plurality of well layers having different thicknesses, the diffraction grating layer 6 optically coupled to the active layer 4, and a pair of cladding layers 2 and 7 with the active layer 4 and the diffraction grating layer 6 interposed therebetween, the diffraction grating layer 6 includes a layer having a higher refractive index than the average refractive index of the core layer when a region between the cladding layers 2 and 7 is defined as a core layer, and the thickness of the well layer increases as a distance from the diffraction grating layer 6 increases.

For the average refractive index (or average dielectric constant) of the core layer, more specifically, for example, when layers in the core layer are numbered in order from the P-type cladding layer as 1, 2, . . . , m (m is a natural number), parameters are set in the numbered layers as follows. •Dielectric constant: $\in_1, \in_2, \ldots, \in_m$ •refractive index: $N_1, N_2, \ldots, N_m$ •film thickness: $W_1, W_2, \ldots, W_m$.

In this case, an average dielectric constant (a square of the refractive index) $\in_{ave}$ becomes an average per volume of a dielectric constant of each layer and is expressed by the following equation.

$$\text{Average dielectric constant } \varepsilon_{ave} = \sum_{i=1}^{m} \varepsilon_i W_i \bigg/ \sum_{i=1}^{m} W_i \quad \text{(Equation 3)}$$

By taking a square root of the average dielectric constant, the average refractive index $N_{ave}$ is defined as the following equation.

$$\text{Average refractive index } N_{ave} = \sqrt{\sum_{i=1}^{m} N_i^2 W_i \bigg/ \sum_{i=1}^{m} W_i} \quad \text{(Equation 4)}$$

In the above-described embodiment, a configuration in which an increase in the refractive index of the diffraction grating layer leads to an increase in the optical confinement factor Γ, and that solves a resultant problem, that is, in which the thickness of the well layer increases as the distance from the diffraction grating layer 6 increases to compensate for rapid degradation of the optical field intensity according to a position in the active layer has been adopted.

That is, since the thickness of the well layer increases as the distance from the diffraction grating layer 6 increases, the optical confinement factors Γqw in each well layer are uniformized, and the gain spectrum corresponding to the well layer of each wavelength is stabilized. Since stable gain spectrums having different peak wavelengths are generated corresponding to the plurality of well layers, any one of the gain spectrums and a selected spectrum including a wavelength (energy band end wavelength) selected by the diffraction grating layer can match even when temperature change occurs, and the dependence of the emission spectrum on temperature caused by overlapping of the spectra can also be reduced.

When the region interposed between the cladding layers is defined as the core layer, the distributed feedback semiconductor laser element described above includes one or more layers having a higher refractive index than a mode equivalent refractive index with respect to light propagating through the core layer between the diffraction grating layer 6 and the well layer 4B. In this example, at least one barrier layer of the active layer satisfying this condition is interposed between the diffraction grating layer and the well layer.

When the number of well layers is two or more, it is possible to sufficiently hold carriers necessary for binding in the well layers and improve a degree of freedom in design.

In the above-described embodiment, when N is a natural number, a thickness of the N-th well layer from the diffraction grating layer among the plurality of well layers is d(N), and the optical confinement factor of the N-th well layer is Γ(N), a relative change in Γ(N) is 10% or less. In this case, since there is no abrupt change in thickness, light emission is further stabilized.

When the diffraction grating layer 6 is one-dimensional and the modified refractive region is aligned and arranged along a straight line, it is preferable that a coupling coefficient κ of the diffraction grating layer 6 satisfies the following relationship expression: $20 \text{ cm}^{-1} \leq \kappa \leq 1000 \text{ cm}^{-1}$.

Further, in the above-described embodiment, an example in which the diffraction grating layer 6 is a two-dimensional diffraction grating layer is shown.

In such a two-dimensional diffraction grating layer, it is preferable that the diffraction grating layer includes a base layer; and a plurality of different-refractive-index regions having a refractive index different from that of the base layer, wherein the different-refractive-index region is arranged at a grating point position on a square grating including (a plurality of) horizontal lines connecting angular positions of 0° and 180° and (a plurality of) vertical lines connecting angular positions of 90° and 270° in a plan view as viewed in a direction perpendicular to the base layer, the diffraction grating layer constitutes a two-dimensional square grating diffraction grating layer, and it is preferable that a coupling coefficient κ1 in a 90° direction and a coupling coefficient κ3 in a 180° direction satisfy the following relationship expression: $100 \text{ cm}^{-1} \leq \kappa 1 \leq 5000 \text{ cm}^{-1}$, and $50 \text{ cm}^{-1} \leq \kappa 3 \leq 5000 \text{ cm}^{-1}$. Such a structure is suitable for miniaturization, and stable oscillation can be realized with high efficiency.

Further, in the quantum well active layer, the active layer 4 includes the barrier layer between the well layers, the band gap energy of the barrier layer is set to be lower than the band gap energy of at least one or both of the cladding layers, and the band gap energy of the well layer is set to be lower than the band gap energy of the barrier layer. The carriers can be efficiently confined in the well layer.

In the above-described embodiment, the example in which the carrier barrier layer CB that suppresses the movement of the carriers between the active layer 4 and the diffraction grating layer 6 is included between the active layer 4 and the diffraction grating layer 6 has been shown. It is possible to suppress leakage of electrons into the diffraction grating layer 6 with a low band gap energy using the carrier barrier layer CB, and to effectively confine the carriers near the light emitting layer.

As described above, the above-described distributed feedback semiconductor laser element includes the active layer 4 having the multiple quantum well structure including the plurality of well layers having different materials, the diffraction grating layer 6 optically coupled to the active layer 4, and a pair of cladding layers 2 and 7 the active layer 4 and the diffraction grating layer 6 interposed therebetween, the diffraction grating layer 6 includes a layer having a higher refractive index than the average refractive index of the core layer when the region interposed between the cladding layers 2 and 7 is defined as a core layer, and the band gap energy defined by the material of the well layer decreases as the distance from the diffraction grating layer 6 increases.

What is claimed is:

1. A distributed feedback semiconductor laser element, comprising:
   an active layer having a multiple quantum well structure including a plurality of well layers having different thicknesses;
   a diffraction grating layer that is optically coupled to the active layer; and
   a pair of cladding layers with the active layer and the diffraction grating layer interposed therebetween,
   wherein when a region that is interposed between the cladding layers is defined as a core layer,
   the diffraction grating layer includes a layer having a refractive index higher than an average refractive index of the core layer, and
   a thickness of the well layer increases as a distance from the diffraction grating layer increases.

2. The distributed feedback semiconductor laser element according to claim 1, comprising:
one or more layers having a higher refractive index than a mode equivalent refractive index with respect to light propagating through the core layer between the diffraction grating layer and the well layers.

3. The distributed feedback semiconductor laser element according to claim 1,
wherein the number of well layers is two or more.

4. The distributed feedback semiconductor laser element according to claim 1,
wherein when N is a natural number, a thickness of an N-th well layer from the diffraction grating layer among the plurality of well layers is d(N), and the optical confinement factor of the N-th well layer is Γ(N), a relative change in F(N) is 10% or less.

5. The distributed feedback semiconductor laser element according to claim 1,
wherein when the diffraction grating layer is one-dimensional, a coupling coefficient κ of the diffraction grating layer satisfies the following relationship expression:

$20 \text{ cm}^{-1} \leq \kappa \leq 1000 \text{ cm}^{-1}$.

6. The distributed feedback semiconductor laser element according to claim 1,
wherein the diffraction grating layer is a two-dimensional diffraction grating layer.

7. The distributed feedback semiconductor laser element according to claim 6,
wherein the diffraction grating layer comprises:
a base layer; and
a plurality of different-refractive-index regions having a refractive index different from that of the base layer,
wherein the different-refractive-index region is arranged at a grating point position on a square grating including horizontal lines connecting angular positions of 0° and 180° and vertical lines connecting angular positions of 90° and 270° in a plan view as viewed in a direction perpendicular to the base layer, the diffraction grating layer constitutes a two-dimensional square grating diffraction grating layer, and
a coupling coefficient κ1 in a 90° direction and a coupling coefficient κ3 in a 180° direction satisfy the following relationship expression:

$100 \text{ cm}^{-1} \leq \kappa1 \leq 5000 \text{ cm}^{-1}$, and $50 \text{ cm}^{-1} \leq \kappa3 \leq 5000 \text{ cm}^{-1}$.

8. The distributed feedback semiconductor laser element according to claim 7,
wherein the active layer includes a barrier layer between the well layers,
band gap energy of the barrier layer is set to be lower than band gap energy of the cladding layer, and
band gap energy of the well layer is set to be lower than the band gap energy of the barrier layer.

9. The distributed feedback semiconductor laser element according to claim 1, comprising:
between the active layer and the diffraction grating layer, a carrier barrier layer that suppresses movement of carriers between the active layer and the diffraction grating layer.

10. A distributed feedback semiconductor laser element, comprising:
an active layer having a multiple quantum well structure including a plurality of well layers having different materials;
a diffraction grating layer that is optically coupled to the active layer; and
a pair of cladding layers with the active layer and the diffraction grating layer interposed therebetween,
wherein when a region that is interposed between the cladding layers is defined as a core layer,
the diffraction grating layer includes a layer having a refractive index higher than an average refractive index of the core layer, and
a band gap energy that is defined by a material of the well layers decreases as a distance from the diffraction grating layer increases.

* * * * *